(12) United States Patent
Tomisaki

(10) Patent No.: US 9,234,923 B2
(45) Date of Patent: Jan. 12, 2016

(54) SIGNAL PROCESSING DEVICE AND SIGNAL PROCESSING METHOD

(71) Applicant: ANRITSU CORPORATION, Kanagawa (JP)

(72) Inventor: Koichiro Tomisaki, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 110 days.

(21) Appl. No.: 14/284,723

(22) Filed: May 22, 2014

(65) Prior Publication Data

US 2015/0015503 A1 Jan. 15, 2015

(30) Foreign Application Priority Data

Jul. 10, 2013 (JP) .................................. 2013-144634

(51) Int. Cl.
G01R 23/16 (2006.01)
(52) U.S. Cl.
CPC ...................................... G01R 23/16 (2013.01)
(58) Field of Classification Search
CPC ........... G09G 5/37; G06F 3/041; G01R 23/16
See application file for complete search history.

(56) References Cited

U.S. PATENT DOCUMENTS

| 8,487,935 | B2 * | 7/2013 | Aoki | G01R 13/0245 345/208 |
| 2006/0085150 | A1 * | 4/2006 | Gorin | G01R 35/005 702/69 |
| 2007/0027675 | A1 * | 2/2007 | Hertz | G01R 23/16 704/200.1 |
| 2012/0036947 | A1 * | 2/2012 | Dobyns | G01R 23/163 73/866.3 |

FOREIGN PATENT DOCUMENTS

JP H11-281684 A 10/1999

* cited by examiner

*Primary Examiner* — Latanya Bibbins
(74) *Attorney, Agent, or Firm* — Pearne & Gordon LLP

(57) ABSTRACT

To provide a signal processing device which enable the user to rapidly repeat an operation of changing to a different resolution with a fingertip touch in the line of sight to a displayed graph. A display unit 31 that displays a graph, a touch panel 32 that is provided so as to correspond to a display screen 31a and includes a touch sensor for outputting positional information associated with a touch operation, and a parameter data table 44 that stores a plurality of processing parameters corresponding to each positional information item. A control unit 50 includes a processing parameter output unit 54 that reads the processing parameter corresponding to the positional information from the parameter data table 44 and outputs the processing parameter to the processing parameter setting unit 21, if the positional information is input.

7 Claims, 12 Drawing Sheets

| Name and code of display image | Name and code of selection region in display image | Function A | Positional information from touch panel | Function B |
|---|---|---|---|---|
| Toggle switch image a | | Display of display mode selection image | K1 | Deletion of first to third analysis menu selection images |
| Display mode selection image b | First selection button b1 | Display of first analysis menu selection screen | K2 | |
| | Second selection button b2 | Display of second analysis menu selection screen | K3 | |
| | Third selection button b3 | Display of third analysis menu selection screen | K4 | |
| | Fourth selection button b4 | Display of fourth analysis menu selection screen | K5 | |
| First analysis menu selection image c | First operation switch c1 | Movement of center frequency position to left in GHz | K6 / K7 | Movement of center frequency position to right in GHz |
| | Second operation switch c2 | Movement of center frequency position to left in MHz | K8 / K9 | Movement of center frequency position to right in MHz |
| | Third operation switch c3 | Movement of center frequency position to left in kHz | K10 / K11 | Movement of center frequency position to right in kHz |
| | Fourth operation switch c4 | Movement of center frequency position to left in Hz | K12 / K13 | Movement of center frequency position to right in Hz |
| Second analysis menu selection image d | First operation switch d1 | Extension of frequency span in GHz | K14 / K15 | Reduction of frequency span in GHz |
| | Second operation switch d2 | Extension of frequency span in MHz | K16 / K17 | Reduction of frequency span in MHz |
| | Third operation switch d3 | Extension of frequency span in kHz | K18 / K19 | Reduction of frequency span in kHz |
| | Fourth operation switch d4 | Extension of frequency span in Hz | K20 / K21 | Reduction of frequency span in Hz |
| Third analysis menu selection image e | First operation switch e1 | Extension of amplitude level (low) | K22 / K23 | Reduction of amplitude level (low) |
| | Second operation switch e2 | Extension of amplitude level (medium) | K24 / K25 | Reduction of amplitude level (medium) |
| | Third operation switch e3 | Extension of amplitude level (high) | K26 / K27 | Reduction of amplitude level (high) |
| Fourth analysis menu selection image f | First operation switch f1 | Extension of measurement time in seconds (s) | K28 / K29 | Reduction of measurement time in seconds (s) |
| | Second operation switch f2 | Extension of measurement time in milliseconds (ms) | K30 / K31 | Reduction of measurement time in milliseconds (ms) |
| | Third operation switch f3 | Extension of measurement time in microseconds (µs) | K32 / K33 | Reduction of measurement time in microseconds (µs) |

Slide touch in left or upper direction ← → Slide touch in right or lower direction

FIG. 3

SIGNAL PROCESSING DEVICE AND SIGNAL PROCESSING METHOD

TECHNICAL FIELD

The present invention relates to a signal processing device and a signal processing method which are applied to a signal analysis device such as a spectrum analyzer.

BACKGROUND ART

For example, a spectrum analyzer disclosed in Patent Document 1 has been known as a signal analysis device for analyzing signals.

The spectrum analyzer disclosed in Patent Document 1 divides the entire measurable frequency band into a plurality of bands, determines a frequency resolution determination IF filter passband width (RBW) which is not affected by a 0-Hz signal and obtains an appropriate sweep speed for each band, stores the frequency resolution determination IF filter passband width in a region of a storage unit, and reads sets of the divided bands and the RBW one by one. Then, the spectrum analyzer sets the read set of the divided band and the RBW to a span setting unit and an RBW setting part to sweep and receive an input frequency, stores the maximum level of the detected output and the frequency thereof in a region, searches for the maximum level $L_M$ among the maximum levels obtained from all of the divided bands and the frequency $F_M$ thereof, and observes observation frequency span having the frequency $F_M$ as a center frequency and the maximum level $L_M$ as a reference level. According to this structure, the spectrum analyzer is less likely to be affected by a 0-Hz signal in an unknown frequency signal mode, as compared to the related art, and can detect an input signal with a low frequency.

RELATED ART DOCUMENT

Patent Document

[Patent Document 1] Japanese Unexamined Patent Application Publication No. 11-281684

DISCLOSURE OF THE INVENTION

Problem that the Invention is to Solve

However, in the spectrum analyzer disclosed in Patent Document 1, when the frequency resolution (the amount of frequency) is set, a switch which is provided on a setting panel and is used to switch different resolutions is operated and the frequency resolution is continuously changed by the resolution set by the operation of a key encoder. However, the switch needs to be operated in order to change the resolution. For this reason, the operation which sets the frequency while changing the frequency resolution becomes complicated.

The invention has been made in view of the above-mentioned problems and an object of the invention is to provide a signal processing device and a signal processing method which can aggregate operations for setting a frequency resolution on a display screen in an integrated fashion and enable the user to rapidly repeat an operation for changing to a different resolution and an operation for changing the display mode of a graph with the change in the resolution with a fingertip touch in a line of sight to the displayed graph.

Means for Solving the Problem

According to a first aspect of the invention, a signal processing device includes: signal processing means (10) that includes a processing parameter setting unit (21), performs a predetermined process for an input signal (S) on the basis of a processing parameter set by the processing parameter setting unit, and outputs a graph display signal for displaying a graph (α) in which a horizontal axis is a frequency and a vertical axis is an amplitude level; display means (31) for receiving the graph display signal output from the signal processing means and displaying the graph on a display screen (31a); a parameter data table (44) that stores the processing parameter set; control means (50, 50A) for reading at least one processing parameter from the parameter data table and outputting the processing parameter to the processing parameter setting unit; and a touch panel (32) that is provided so as to correspond to the display screen and includes a touch sensor which outputs positional information associated with a touch operation. The parameter data table stores a plurality of the processing parameters with different resolutions corresponding to each positional information item. The control means includes a processing parameter output unit (54) that reads the processing parameters with different resolutions corresponding to the positional information from the parameter data table and outputs the processing parameters to the processing parameter setting unit, if the positional information is input from the touch panel. The processing parameter output unit of the control means reads at least one change value as the processing parameter corresponding to the positional information from the parameter data table and outputs the change value to the processing parameter setting unit such that the change value is increased or decreased with respect to a currently set value in correspondence with a slide touch direction included in the positional information.

According to the signal processing device of the first aspect of the invention, the above-mentioned structure makes it possible to acquire the processing parameters input to the processing parameter setting unit of the signal processing means in stages, on the basis of the positional information from the touch panel provided on the display screen of the display means. Therefore, the resolution is switched by only a simple touch operation.

Therefore, according to the signal processing device of the first aspect of the invention, it is possible to aggregate the operations for setting the frequency resolution on the display screen in an integrated fashion and to enable the user to rapidly repeat an operation for changing to a different resolution and an operation for changing the display mode of a graph with the change in the resolution with a fingertip touch in a line of sight to the displayed graph. In addition, since the resolution is switched with a focus on the display screen, it is possible to reduce the burden of the operator.

According to the signal processing device of the first aspect of the invention, it is possible to change the display of the graph, without a complicated operation, such as the operation of the key encoder on the setting panel, unlike the related art.

According to a second aspect of the invention, in the signal processing device according to the first aspect, the processing parameter setting unit may include at least one of a center frequency setting unit (22) that sets a center frequency of the graph, a frequency span setting unit (23) that sets a frequency span of the graph, an amplitude level setting unit (25) that sets an amplitude level of the graph, and a measurement time setting unit (26) that sets a measurement time of the input signal. The parameter data table may store a plurality of center frequency change values with different resolutions at which the center frequency is changed, a plurality of frequency span change values with different resolutions at which the frequency span is changed, a plurality of amplitude level change values with different resolutions at which the amplitude level is changed, or a plurality of measurement time change values with different resolutions at which the measurement time is changed, as the processing parameters which are stored so as to correspond to the center frequency setting unit, the frequency span setting unit, the amplitude level setting unit, or the measurement time setting unit in the processing parameter setting unit. The processing parameter output unit may read, as the processing parameter corresponding to the positional information, one of the center frequency change values, one of the frequency span change values, one of the amplitude level change values, or one of the measurement time change values from the parameter data table and output the read change value to the corresponding center frequency setting unit, the corresponding frequency span setting unit, the corresponding amplitude level setting unit, or the corresponding measurement time setting unit in the processing parameter setting unit such that the change value is increased or decreased with respect to the currently set value in correspondence with the slide touch direction included in the positional information.

According to the signal processing device of the second aspect of the invention, the above-mentioned structure makes it possible to rapidly and freely change the center frequency, the frequency span, the amplitude level, or the measurement time.

According to the signal processing device of the second aspect of the invention, the above-mentioned structure makes it possible to rapidly and freely change the center frequency, the frequency span, the amplitude level, or the measurement time by changing the slide touch direction.

According to a third aspect of the invention, in the signal processing device according to the above-mentioned aspect, the control means may further include: an analysis menu selection image output unit (53, 53A) that reads data for an analysis menu selection image (c, d, e, f) corresponding to predetermined positional information from a display image data table (43, 43A) and outputs the data such that the analysis menu selection image is displayed on the display screen, if the predetermined positional information is input from the touch panel; a branch processing unit (55) that returns an operation to the processing parameter output unit if positional information corresponding to one parameter setting item is input from the touch panel, with the analysis menu selection image displayed on the display screen; and an analysis menu selection image deletion unit (56) that deletes the analysis menu selection image displayed on the display screen if predetermined positional information is input from the touch panel, with the analysis menu selection image displayed on the display screen.

According to the above-mentioned structure, in the signal processing device according to the third aspect of the invention, when predetermined positional information is input from the touch panel, the analysis menu selection image output unit reads data for the analysis menu selection image corresponding to the positional information from the display image data table and outputs the data such that the analysis menu selection image is displayed on the display screen. When the positional information corresponding to one of the parameter setting items is continuously input from the touch panel, with the analysis menu selection image displayed on the display screen, the branch processing unit (55) returns the operation to the processing parameter output unit. Then, when predetermined positional information is input from the touch panel, with the analysis menu selection image displayed on the display screen, the analysis menu selection image deletion unit (56) deletes the analysis menu selection image displayed on the display screen.

Therefore, according to the signal processing device of the third aspect of the invention, the user can touch the touch panel to display the analysis menu selection images (c, d, e, f, g) including a plurality of parameter setting items with different resolutions on the display screen. In addition, when the user repeats an operation of touching the touch panel to select a desired parameter setting item, it is possible to repeatedly output the processing parameter to the processing parameter output unit and to perform the desired graph display. When the desired graph display is performed, the user can touch a predetermined position of the touch panel to delete the analysis menu selection image. As such, when the positional information is input, the processing parameter setting unit sets the processing parameter for changing the center frequency, the frequency span, the amplitude level, or the measurement time and it is possible to perform the desired graph display. The resolution is switched with a focus on the display screen. Therefore, it is possible to aggregate the operations for setting the frequency resolution on the display screen in an integrated fashion and to reduce the burden of the operator.

According to a fourth aspect of the invention, in the signal processing device according to the above-mentioned aspect, the processing parameter setting unit may include at least a plurality of setting units among the center frequency setting unit, the frequency span setting unit, the amplitude level setting unit, and the measurement time setting unit. The display image data table may store a plurality of analysis menu selection images corresponding to the plurality of setting units included in the processing parameter setting unit and store data for a display mode selection image (b) for selecting any one of the analysis menu selection images. The control means may further include a display mode selection image output unit (52) that reads the display mode selection image from the display image data table and outputs the display mode selection image so as to be displayed on a layer that is closer to a surface than the graph displayed on the display screen, if predetermined positional information is input from the touch panel; and deletes the display mode selection image when the analysis menu selection image is displayed. If positional information, which corresponds to a touch operation of selecting any one of a plurality of selection buttons (b1, b2, b3, b4) in the display mode selection image, is input from the touch panel, the analysis menu selection image output unit may read the analysis menu selection image corresponding to the positional information from the display image data table and output the analysis menu selection image to the display means.

According to the signal processing device of the fourth aspect of the invention, the above-mentioned structure makes it possible to select a desired one of a plurality of analysis menu selection images in the displayed display mode selection image, to display the desired analysis menu selection image, and to enlarge the operation switch included in each analysis menu selection image. Therefore, the signal processing device has high operability.

According to a fifth aspect of the invention, in the signal processing device according to the above-mentioned aspect, the display image data table may store data for a toggle switch image (a). The control means may further include a toggle switch image output unit (51) that reads the toggle switch image from the display image data table and outputs the toggle switch image so as to be displayed on the display screen, when the graph is displayed on the display screen. The display mode selection image output unit may read the display mode selection image from the display image data table if positional information corresponding to the toggle switch image is input from the touch panel.

According to the signal processing device of the fifth aspect of the invention, the above-mentioned structure makes it possible to display the display mode selection image when the toggle switch image is touched, to select a desired one of a plurality of analysis menu selection images in the display mode selection image, to display the selected analysis menu selection image, and to enlarge the operation switch included in each analysis menu selection image. Therefore, the signal processing device has high operability.

According to a sixth aspect of the invention, there is provided a signal processing method of performing signal processing in a signal processing device which includes a processing parameter setting unit (21) that sets a processing parameter for performing a predetermined process to an input signal (S), signal processing means (10) for performing a predetermined process for the input signal on the basis of the processing parameter and outputting a graph display signal for displaying a graph (α) in which a horizontal axis is a frequency and a vertical axis is an amplitude level, a touch panel (32) that is provided so as to correspond to a display screen (31a) and includes a touch sensor which outputs positional information associated with a touch operation, a parameter data table (44) that stores a plurality of the processing parameters corresponding to each positional information item, reads at least one of the processing parameters from the parameter data table, inputs the processing parameter to the processing parameter setting unit to change a signal processing mode of the signal processing means, and changes the display of the graph. The signal processing method includes a step (S10, S26) of specifying whether the positional information is input by a slide touch operation in one direction or the other direction, reading the processing parameter corresponding to the positional information from the parameter data table, and outputting the processing parameter to the processing parameter setting unit of the signal processing means, if the positional information corresponding to one parameter setting item is input from the touch panel.

According to the signal processing method of the sixth aspect of the invention, the above-mentioned structure makes it possible to aggregate the operations for setting the frequency resolution on the display screen in an integrated fashion, to rapidly repeat an operation for changing to a different resolution and an operation for changing the display mode of the graph with the change in the resolution with a fingertip touch in a line of sight to the displayed graph. In addition, since the resolution is switched with a focus on the display screen, it is possible to reduce the burden of the operator.

According to a seventh aspect of the invention, in the signal processing method according to the above-mentioned aspect, the signal processing device may further include: a processing parameter output unit (54) that reads the processing parameters with different resolutions corresponding to the positional information from the parameter data table and outputs the processing parameter to the processing parameter setting unit, if the positional information is input from the touch panel; and an analysis menu selection image deletion unit (56) that deletes an analysis menu selection image displayed on the display screen. The signal processing method may further include: a step (S2, S22) of displaying analysis menu selection images (c, d, e, f, g) including a plurality of parameter setting items with different resolutions on the display screen if predetermined positional information associated with the touch operation is input from the touch panel; a branch step (S11, S12, S27, S28) of determining whether to return an operation to the processing parameter output unit or to move the operation to the analysis menu selection image deletion unit, if predetermined positional information is input from the touch panel, with the analysis menu selection image displayed on the display screen; and a step (S13, S29) of deleting the analysis menu selection image displayed on the display screen if predetermined positional information is input from the touch panel, with the analysis menu selection image displayed on the display screen.

Therefore, according to the signal processing method of the seventh aspect of the invention, when the touch panel is touched, the above-mentioned structure makes it possible to display the analysis menu selection images (c, d, e, f, g) including a plurality of parameter setting items with different resolutions on the display screen. In addition, when the user repeats an operation of touching the touch panel to select a desired parameter setting item, it is possible to repeatedly output the processing parameter to the processing parameter output unit. When the desired graph display is performed, the user can touch the touch panel to delete the analysis menu selection image. As such, when the positional information is input, the processing parameter setting unit sets the processing parameter for changing the center frequency, the frequency span, the amplitude level, or the measurement time and it is possible to perform the desired graph display. The resolution is switched with a focus on the display screen. Therefore, it is possible to aggregate the operations for setting the frequency resolution on the display screen in an integrated fashion and to reduce the burden of the operator.

Advantage of the Invention

The invention can provide a signal processing device and a signal processing method which can aggregate operations for setting a frequency resolution on a display screen in an integrated fashion and enable the user to rapidly repeat an operation for changing to a different resolution and an operation for changing the display mode of a graph with the change in the resolution with a fingertip touch in a line of sight to the displayed graph.

BRIEF DESCRIPTION OF THE DRAWINGS

FIG. 3 is a table illustrating the relationship among an image, the function of a selection button, the function of an operation switch, and positional information in FIG. 2.

FIG. 5(a) is a diagram illustrating an example of the display of the first analysis menu selection image, FIG. 5(b) is a diagram illustrating an example of the detailed display of a numerical display portion when a second operation switch c2 is touched and slid, and FIG. 5(c) is a diagram illustrating an example of the display of the numerical display portion when a first operation switch c1 is touched and slid.

BEST MODE FOR CARRYING OUT THE INVENTION

Hereinafter, embodiments of the invention will be described with reference to the drawings.

First Embodiment

Figure 1:
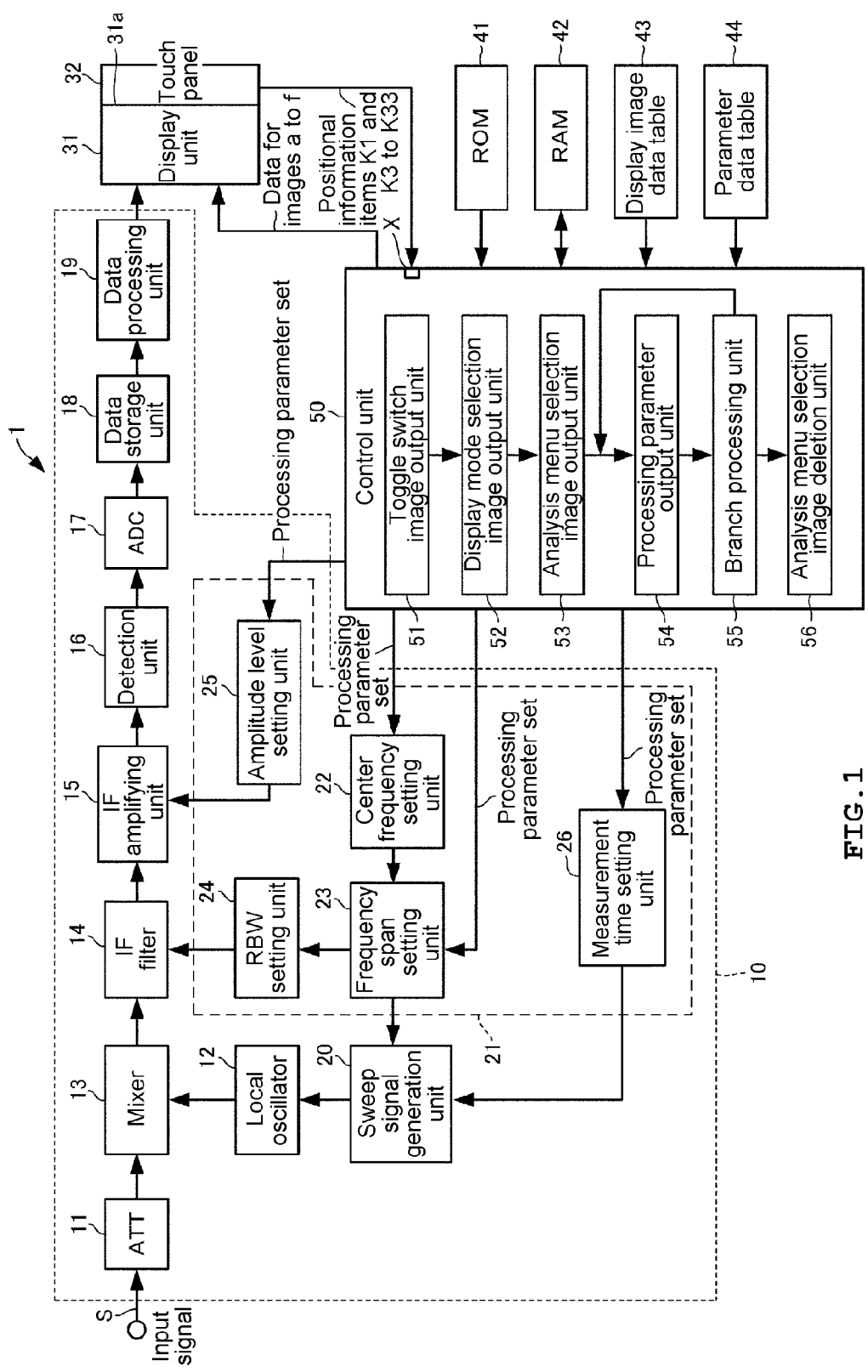
FIG. 1 is a functional block diagram illustrating a signal processing device according to a first embodiment of the invention.

FIG. 1 is a functional block diagram illustrating a signal processing device 1 which is applied to a signal analysis device such as a spectrum analyzer. The signal processing device 1 includes a signal analysis unit 10 serving as signal processing means for setting a measurable frequency range (frequency band) of an input signal S, which is a signal to be measured, on the basis of a processing parameter, performing signal processing to obtain a desired frequency spectrum waveform, and outputting a graph display signal, a display unit 31 that receives the graph display signal output from the signal analysis unit 10 and displays a frequency spectrum waveform graph, a touch panel 32 that is provided so as to correspond to a display screen 31a of the display unit 31, a control unit 50 that performs a control process of changing a processing parameter as desired and outputting the processing parameter to the signal analysis unit 10, and a ROM 41, a RAM 42, a display image data table 43, and a parameter data table 44 that are connected to the control unit 50.

As shown in FIG. 1, the signal analysis unit 10 includes an attenuator (ATT) 11, a local oscillator (LO) 12, a mixer (frequency mixer) 13, an intermediate frequency (IF) filter 14, an IF amplifying unit 15, a detection unit 16, an analog/digital converter (ADC) 17, a data storage unit 18, a data processing unit 19, and a sweep signal generation unit 20. These components receive the input signal S as the signal to be measured, perform signal processing for obtaining a desired frequency spectrum waveform for the input signal S on the basis of the processing parameters, and output the graph display signal. The display unit 31 receives the graph display signal and displays the frequency spectrum waveform graph.

In addition, the signal analysis unit 10 includes a processing parameter setting unit 21 in order to display a desired frequency spectrum waveform on the display unit 31. The processing parameter setting unit 21 includes a center frequency setting unit 22, a frequency span setting unit 23, a resolution bandwidth (RBW) setting unit 24, an amplitude level setting unit 25, and a measurement time setting unit 26. The center frequency is a frequency value (Hz) indicating the center of the display screen and the frequency span is a set display (measurement) range, such as the range (Hz) of a bandwidth displayed on the display screen.

The ATT 11 is an electronic component which has a resistor provided therein, attenuates the high-frequency input signal S, which is the signal to be measured, to a signal level (for example, decibel) suitable for signal analysis, and does not change impedance. The ATT 11 attenuates the input signal S to an optimal mixer input level which does not have an effect on measurement.

The local oscillator 12 generates a sine wave with a frequency that is higher or lower than the frequency value of the original signal by the frequency value of a conversion destination using a local oscillator. The local signal oscillated by the local oscillator 12 is swept over a predetermined frequency range by a sweep signal output from the sweep signal generation unit 20.

The mixer 13 is a characteristic component of a heterodyne spectrum analyzer, mixes the input signal attenuated by the ATT 11 with the local signal oscillated by the local oscillator 12 to generate an output signal including a frequency component corresponding to the difference between the two signals, and outputs the output signal. An intermediate frequency signal is output from a frequency signal including an intermediate frequency which is changed in synchronization with a sweep operation.

Therefore, when the oscillating frequency of the local oscillator 12 is adjusted according to the frequency to be measured (the frequency of the input signal S attenuated by the ATT 11) (the oscillating frequency is set to a frequency that is a predetermined value away from the frequency to be measured), it is possible to obtain a signal in which a spectrum in the vicinity of the frequency to be measured seems to be copied to the vicinity of a predetermined fixed frequency (intermediate frequency; IF).

In this embodiment, the IF filter 14 includes an RBW filter, which is, for example, an analog bandpass filter, and a logarithmic amplifier.

In the IF filter 14, the RBW filter causes frequencies corresponding to the spectrum in the vicinity of the frequency to be measured to appear around the intermediate frequency in the output from the mixer 13. Therefore, it is possible to extract a signal component in a predetermined frequency range in the vicinity of the frequency, using a bandpass filter with a fixed center frequency.

When the frequency of a mixed signal of the input signal S and the local signal, which is obtained by the mixer 13, is equal to the center frequency of the IF filter 14, the IF filter 14 outputs the mixed signal. The measurement frequency range is determined by the center frequency of the IF filter 14 and the frequency range of the local signal oscillated by the local oscillator 12.

The logarithmic amplifier is an amplifier which outputs an amplified signal corresponding to the logarithm of the input signal S, facilitates the collective treatment of signals in a wide dynamic range which is obtained by performing logarithmic compression for the input signal S, and enables a linear display device to perform display corresponding to a decibel.

Since the intermediate frequency signal output from the mixer 13 is changed in synchronization with the sweep operation, the IF filter 14 outputs a signal with the time-series waveform of each frequency component of the signal to be measured that is converted into the intermediate frequency signal over time, within one sweep time (sweep period).

The gain of the IF amplifying unit 15 is controlled by a reference level which is set by the processing parameter in the amplitude level setting unit 25. It is possible to change the display value of the amplitude level of a graph display signal which is graphed and displayed on the display screen 31*a* of the display unit 31, depending on the processing parameter, by changing the processing parameter input to the amplitude level setting unit 25.

The detection unit 16 is a component which converts the intermediate frequency signal extracted by the IF filter 14 into a direct current. In the spectrum analyzer, envelope detection is mainly used. The detection unit 16 detects the peak value of each time axis position in the analog frequency spectrum waveform output from the IF amplifying unit 15 and obtains a final frequency spectrum waveform in an envelope-detected state.

The signal which is detected within the sweep period indicates the magnitude of the time-series waveform at the swept frequency. Therefore, when the horizontal axis is a frequency and the vertical axis is an amplitude level (decibel) in the display screen 31*a* of the display unit 31, a graph α displayed on the display screen 31*a* is a frequency spectrum waveform.

The ADC 17 converts the graph display signal indicating the frequency spectrum waveform which is output from the detection unit 16 into digital data and the data storage unit 18 stores the digital data.

The data processing unit 19 is a video filter or a video bandwidth (VBW) filter serving as a low-pass filter (high cut filter), performs signal processing for the digital data stored in the data storage unit 18 such that it operates as a filter for a variation in the detected signal over time, not the spectrum of the signal, calculates the intensity of the input signal S for each frequency, and outputs a video signal (graph display signal) which can be displayed as the frequency spectrum waveform.

In the sweep signal generation unit 20, the generation of a sweep ramp signal is controlled on the basis of the sweep time which is set by the processing parameter in the measurement time setting unit 26.

The center frequency setting unit 22 generates a signal for setting the center frequency of the entire measurable frequency band for the frequency of the input signal S, on the basis of the processing parameter from the control unit 50, and outputs the signal to the frequency span setting unit 23.

The frequency span setting unit 23 outputs, to the sweep signal generation unit 20 and the RBW setting unit 24, a signal for setting the frequency span, that is, a signal for setting the lower limit frequency and the upper limit frequency of the entire measurable frequency band which has the center frequency of the entire measurable frequency band of the input signal S as its center, on the basis of the setting of the center frequency by the center frequency setting unit 22 and the processing parameters from the control unit 50.

The RBW setting unit 24 sets the passband width (RBW) of the IF filter 14, in order to change the frequency resolution of the measured spectrum depending on the bandwidth of the frequency span set by the frequency span setting unit 23.

A reference level is set on the basis of the processing parameter from the control unit 50 and the amplitude level setting unit 25 sets the gain of the IF amplifying unit 15 and changes the display value of the amplitude level of the graph display signal, which is graphed and displayed on the display screen 31*a* of the display unit 31, depending on the processing parameter.

The sweep time is set on the basis of the processing parameter from the control unit 50 and the measurement time setting unit 26 controls the sweep ramp signal generated by the sweep signal generation unit 20 on the basis of the sweep time.

The center frequency setting unit 22, the frequency span setting unit 23, the amplitude level setting unit 25, and the measurement time setting unit 26 store the processing parameters input from the control unit 50 when the system shuts down. The RBW setting unit 24 stores the set passband width of the IF filter 14 when the system shuts down.

The display unit 31 receives the video signal from the data processing unit 19 and displays the graph α of the frequency spectrum waveform in a frequency domain (the horizontal axis is a frequency and the vertical axis is an amplitude level) on the display screen 31*a*. For example, a flat panel display with a flat housing and a planar screen, such as a liquid crystal display or an electroluminescent (EL) display, is used as the display unit 31.

The display unit 31 receives the graph display signal output from the data processing unit 19 of the signal analysis unit 10 and displays the intensity of the input signal S on the frequency axis using the graph α in which the horizontal axis is a frequency and the vertical axis is an amplitude level.

The ROM 41 stores a program which is used by the control unit 50 to perform a control process of directing the signal analysis unit 10 to output the processing parameters in correspondence with the positional information input from the touch panel 32 and a control process of outputting various images for changing the display mode of the graph α to the display unit 31. The program causes various functional blocks formed in the control unit 50 to perform a series of processes in the flowchart shown in FIG. 9.

The RAM 42 is used as a work area for the control operation of the control unit 50, or it is temporarily used as, for example, storage means.

Figure 2:
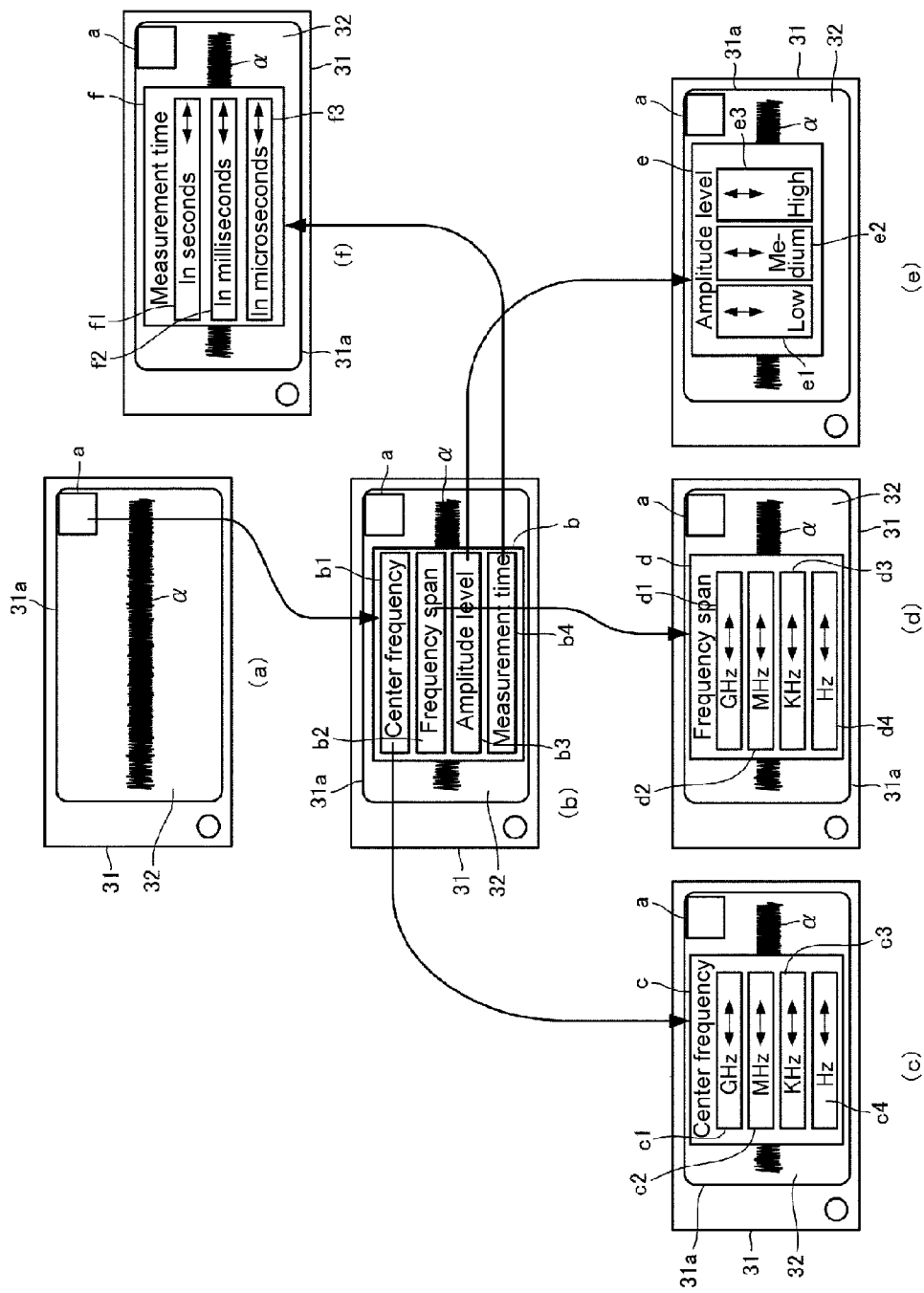
FIG. 2 is a transition diagram illustrating the display state of a display unit of the signal processing device according to the first embodiment of the invention.

As shown in a display state transition diagram of FIG. 2, the display image data table 43 stores six image display data items, that is, a toggle switch image a, a display mode selection image b, and four analysis menu selection images c, d, e, and f.

The parameter data table 44 stores the processing parameters required for the settings of the center frequency setting unit 22, the frequency span setting unit 23, the amplitude level setting unit 25, and the measurement time setting unit 26 in order to perform a desired signal analysis process.

The parameter data table 44 stores, as the processing parameters, a plurality of center frequency change values with different resolutions which change the center frequency, a plurality of frequency span change values with different resolutions which change the frequency span, a plurality of amplitude level change values with different resolutions which change the amplitude level, and a sweep time change value for changing the measurement time so as to be associated with the positional information.

Therefore, a processing parameter output unit 54, which will be described below, can easily perform a process of checking the positional information and the processing parameters and a reading process. In this embodiment, it is assumed that an initial value is used for the RBW setting unit 24 and is not stored in the parameter data table 44.

The processing parameters output to the center frequency setting unit 22 define the amount of movement of the center frequency and include positive processing parameters with four different levels of resolution, GHz, MHz, kHz, and Hz, of the amount of movement of the center frequency corresponding to positional information items K6, K8, K10, and K12 and negative processing parameters with four different levels of resolution, GHz, MHz, kHz, and Hz, of the amount of movement of the center frequency corresponding to positional information items K7, K9, K11, and K13 in the table (see FIG. 3), which will be described below.

The processing parameters output to the frequency span setting unit 23 define a lower-limit-side measurable frequency span and an upper-limit-side measurable frequency span which have the center frequency set by the center frequency setting unit 22 as their centers and include positive processing parameters with four different levels of resolution, GHz, MHz, kHz, and Hz, of the frequency span corresponding to positional information items K14, K16, K18, and K20 and negative processing parameters with four different levels of resolution, GHz, MHz, kHz, and Hz, of the frequency span corresponding to positional information items K15, K17, K19, and K21 in the table (see FIG. 3), which will be described below.

The processing parameters output to the amplitude level setting unit 25 define the amplitude level of the graph α displayed on the basis of the set center frequency and frequency span and include positive processing parameters with three different levels of resolution, a high signal level (for example, 10 dB), a medium signal level (for example, 5 dB), and a low signal level (for example, 1 dB), of the amplitude level corresponding to positional information items K22, K24, and K26 and negative processing parameters with three different levels of resolution, a high signal level (for example, 10 dB), a medium signal level (for example, 5 dB), and a low signal level (for example, 1 dB), of the amplitude level corresponding to positional information items K23, K25, and K27 in the table (see FIG. 3), which will be described below.

The processing parameters output to the measurement time setting unit 26 define the measurement time of the input signal S and include positive processing parameters indicating that the measurement times corresponding to positional information items K28, K30, and K32 are extends in three different units, that is, in seconds (s), milliseconds (ms), and microseconds (μs) and negative processing parameters indicating that the measurement times corresponding to positional information items K29, K31, and K33 are reduced in three different units, that is, in seconds (s), milliseconds (ms), and microseconds (μs) in the table (see FIG. 3), which will be described below.

In the table shown in FIG. 3, the left and right positional information items in the same row may have the same absolute value, the storage of the positional information items on the right half of the table may be omitted, and the processing parameter output unit 54, which will be described below, may output the processing parameters such that the positive values are associated with the negative values.

In order to perform the movement (setting) of the center frequency, the change of the frequency span, and the change of the amplitude level, the processing parameters with at least two different levels of resolution may be stored in the parameter data table 44 so as to correspond to each of the center frequency setting unit 22, the frequency span setting unit 23, and the amplitude level setting unit 25.

In this embodiment, the processing parameters with four different levels of resolution are prepared for the center frequency setting unit 22 and the frequency span setting unit 23 and the processing parameters with three different levels of resolution are prepared for the amplitude level setting unit 25.

The signal processing device 1 includes a touch panel 32 that is provided so as to correspond to the display screen 31a of the display unit 31. For example, when the operator touches a desired display element displayed on the display screen 31a of the display unit 31 with a fingertip or an electrostatic pen to designate the desired display element, the touch panel 32 detects the touch operation, specifies the designated display element, and outputs positional information corresponding to the touch position to an input terminal X of the control unit 50.

The touch panel 32 has the following structure: a plurality of switches formed by transparent electrodes which are arranged in a 10×10 matrix are arranged on a transparent panel; when the operator presses a portion of the surface, two upper and lower electrodes contact each other to form an electric circuit; and positional information in the horizontal and vertical directions is detected.

In the touch panel 32, the following switches can be used instead of the matrix switch: a resistive-film-type switch; a surface acoustic wave switch; an electromagnetic induction switch requiring a dedicated electronic pen which is called an electrostatic pen; and an electromagnetic induction switch which does not require an electronic pen.

The touch panel 32 is not limited to a three-layer laminated type of a cover, a conductive film, and a glass substrate, but may be a projection type including an insulating film, an electrode layer which is provided below the insulating film, and a substrate layer having a control IC mounted thereon, or an "in-cell type" in which a touch input function is provided in a display.

Next, the combination of various images displayed on the display unit 31 and the touch panel 32 will be described using the table shown in FIG. 3 and the display state transition diagram shown in FIG. 2.

The table includes the relationship among the name and code of a display image which is sequentially displayed on the display unit 31, the name and code of a selected region (a selection button or an operation switch) in the display image, a function A when the selection button is touched or the operation switch is touched and slid in the left direction or the upper direction, a function B when the operation switch is touched and slid in the right direction or the lower direction, and positional information which is output from the touch panel 32 by the touch or the slide touch.

As shown in the transition diagram, in "Name and code of selected region in display image" on the upper left side of the table, the toggle switch image a, the display mode selection image b, the first analysis menu selection image c, the second analysis menu selection image d, the third analysis menu selection image e, and the fourth analysis menu selection image f are displayed on the display unit 31 in descending order.

The toggle switch image a is displayed first or constantly and is connected with the touch panel 32, without the display mode selection image b being displayed. When a portion of the touch panel 32 corresponding to the toggle switch image a is touched, the touch panel 32 outputs the positional information K1 in the table to instruct a corresponding function among the functions A in the table, that is, the display of the display mode selection image b is instructed.

The toggle switch image a is connected with the touch panel 32, with any one of the first to fourth analysis menu selection images c to f being displayed. When a portion of the touch panel 32 corresponding to the toggle switch image a is touched, the touch panel 32 outputs the positional information K1 in the table to instruct a corresponding function among the functions B in the table, that is, the deletion of the first to fourth analysis menu selection images c to f displayed on the display unit 31 is instructed.

Figure 4:
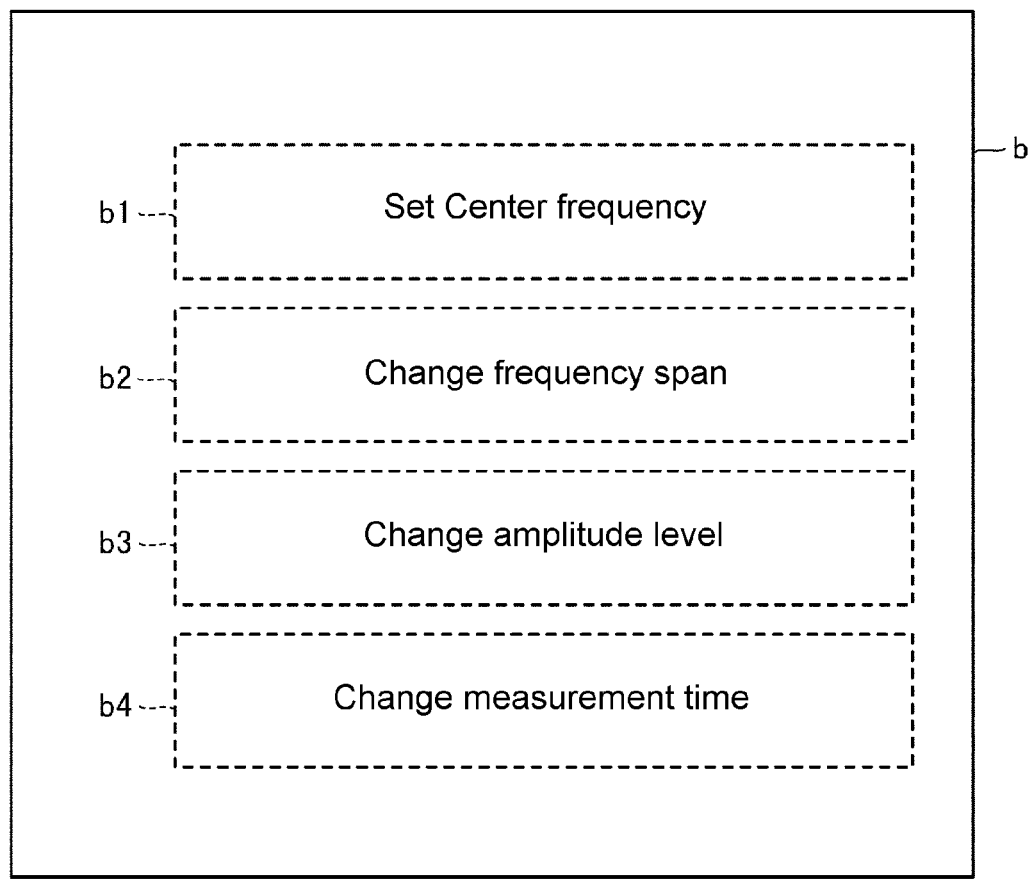
FIG. 4 is a diagram illustrating an example of the display of a display mode selection image in a signal processing device according to the first embodiment of the invention.

FIG. 4 shows an example of the detailed display of the display mode selection image b. The display mode selection image b includes first to fourth selection buttons b1 to b4 and is connected with the touch panel 32. When any one of the first to fourth selection buttons b1 to b4 is touched, the touch panel 32 outputs any one of the positional information items K2 to K5 in the table to instruct a corresponding function among the functions A in the table.

Figure 5:
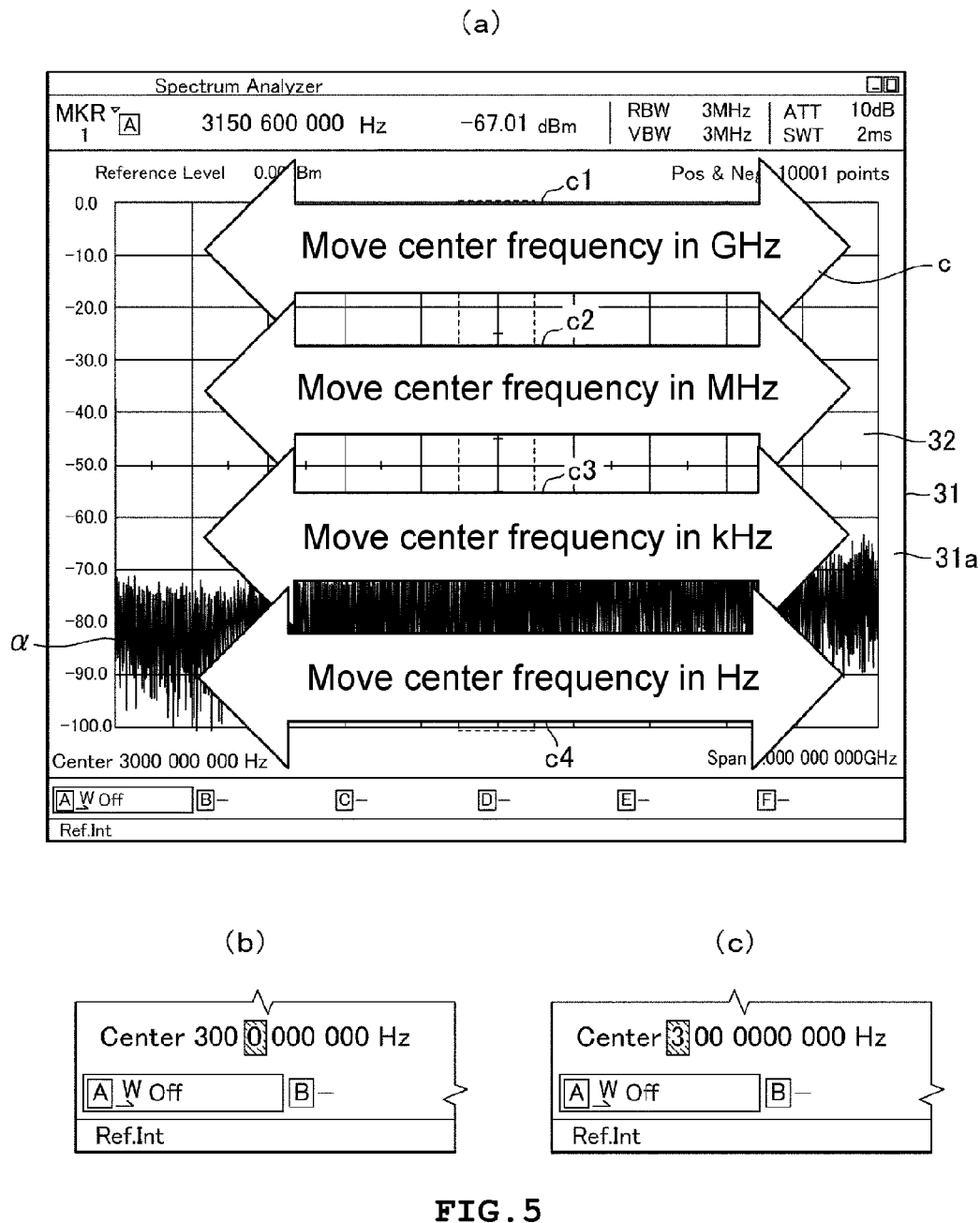
FIG. 5 is a diagram illustrating an example of the display of a first analysis menu selection image in the signal processing device according to the first embodiment of the invention.

FIG. 5 shows an example of the detailed display of the first analysis menu selection image c. The first analysis menu selection image c includes first to fourth horizontally long operation switches c1 to c4 for displaying, as a menu, the processing parameters with four different levels of resolution, GHz, MHz, kHz, and Hz, of the amount of movement of the center frequency and is connected with the touch panel 32.

When any one of the first to fourth operation switches c1 to c4 is touched and slid in the left direction (one direction), the touch panel 32 outputs any one of the positional information items K6, K8, K10, and K12 to instruct a corresponding function among the functions A in the table.

When any one of the first to fourth operation switches c1 to c4 is touched and slid in the right direction (the other direction), the touch panel 32 outputs any one of the positional information items K7, K9, K11, and K13 to instruct a corresponding function among the functions B in the table.

In this embodiment, the display position (input target digit) of a digit marker in a numerical display portion is changed in operative association with a change in the resolution, that is, the slide touch operation of the first to fourth operation switches c1 to c4.

Specifically, as shown in FIG. 5(a), the second operation switch c2 is touched and slid with Center "3 000 000 000 Hz" displayed on the numerical display portion, the digit marker (for example, a hatched frame in FIG. 5(a)) is displayed at the seventh "0" from the lowest-order digit in the display in operative association with the slid touch operation, as shown in FIG. 5(b). Similarly, in the state shown in FIG. 5(a), when the first operation switch c1 is touched and slid, the digit marker is displayed at the tenth "3" from the lowest-order digit in the display in operative association with the slid touch operation, as shown in FIG. 5(c).

The display position of the digit marker enables the operator to understand the resolution of the graph α displayed on the display screen 31a.

In addition, the display position of the digit marker on the numerical display portion holds for an example of the display of the second analysis menu selection image d shown in FIG. 6, which will be described below, an example of the display of the third analysis menu selection image e shown in FIG. 7, which will be described below, and an example of the display of the fourth analysis menu selection image f shown in FIG. 8, which will be described below.

Figure 6:
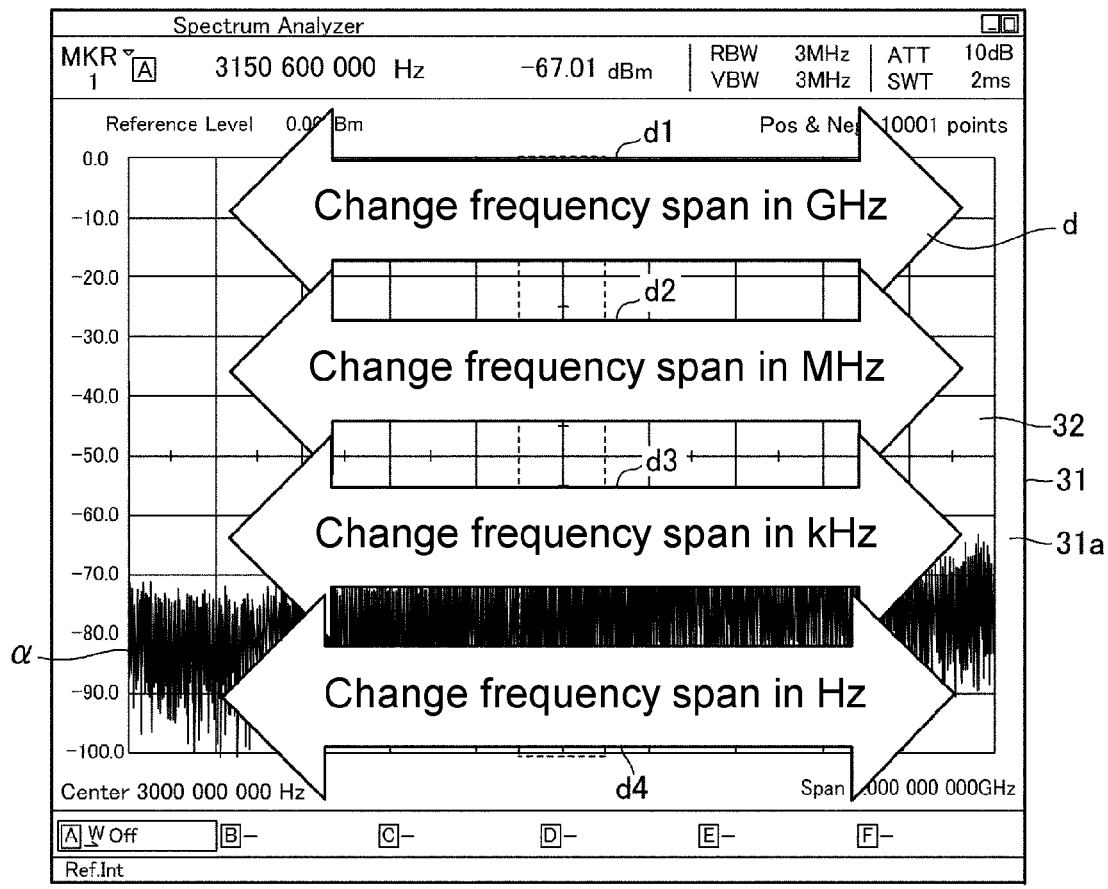
FIG. 6 is a diagram illustrating an example of the detailed display of a second analysis menu selection image in the signal processing device according to the first embodiment of the invention.

FIG. 6 shows an example of the detailed display of the second analysis menu selection image d. The second analysis menu selection image d includes first to fourth horizontally long operation switches d1 to d4 for displaying, as a menu, the processing parameters with four different levels of resolution, GHz, MHz, kHz, and Hz, of the frequency span and is connected with the touch panel 32.

When any one of the first to fourth operation switches d1 to d4 is touched and slid in the left direction (one direction), the touch panel 32 outputs any one of the positional information items K14, K16, K18, and K20 to instruct a corresponding function among the functions A in the table.

When any one of the first to fourth operation switches d1 to d4 is touched and slid in the right direction (the other direction), the touch panel 32 outputs any one of the positional information items K15, K17, K19, and K21 to instruct a corresponding function among the functions B in the table.

Figure 7:
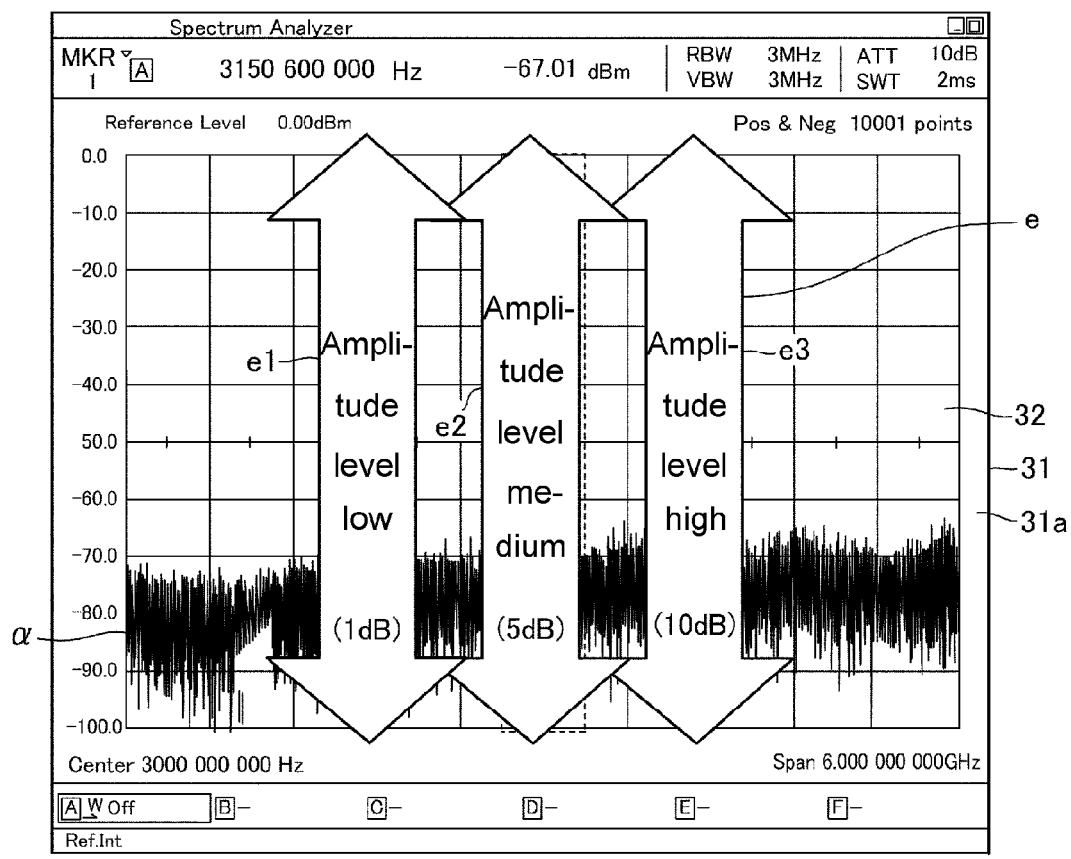
FIG. 7 is a diagram illustrating an example of the detailed display of a third analysis menu selection image in the signal processing device according to the first embodiment of the invention.

FIG. 7 shows an example of the detailed display of the third analysis menu selection image e. The third analysis menu selection image e includes first to third vertically long operation switches e1 to e3 for displaying, as a menu, the processing parameters with three different levels of resolution, a low level (for example, 1 dB), a medium level (for example, 5 dB), and a high level (for example, 10 dB), of the amplitude level and is connected with the touch panel 32.

When any one of the first to third operation switches e1 to e3 is touched and slid in the upper direction (one direction), the touch panel 32 outputs any one of the positional information items K22, K24, and K26 to instruct a corresponding function among the functions A in the table.

When any one of the first to third operation switches e1 to e3 is touched and slid in the lower direction (the other direction), the touch panel 32 outputs any one of the positional information items K23, K25, and K27 to instruct a corresponding function among the functions B in the table.

Figure 8:
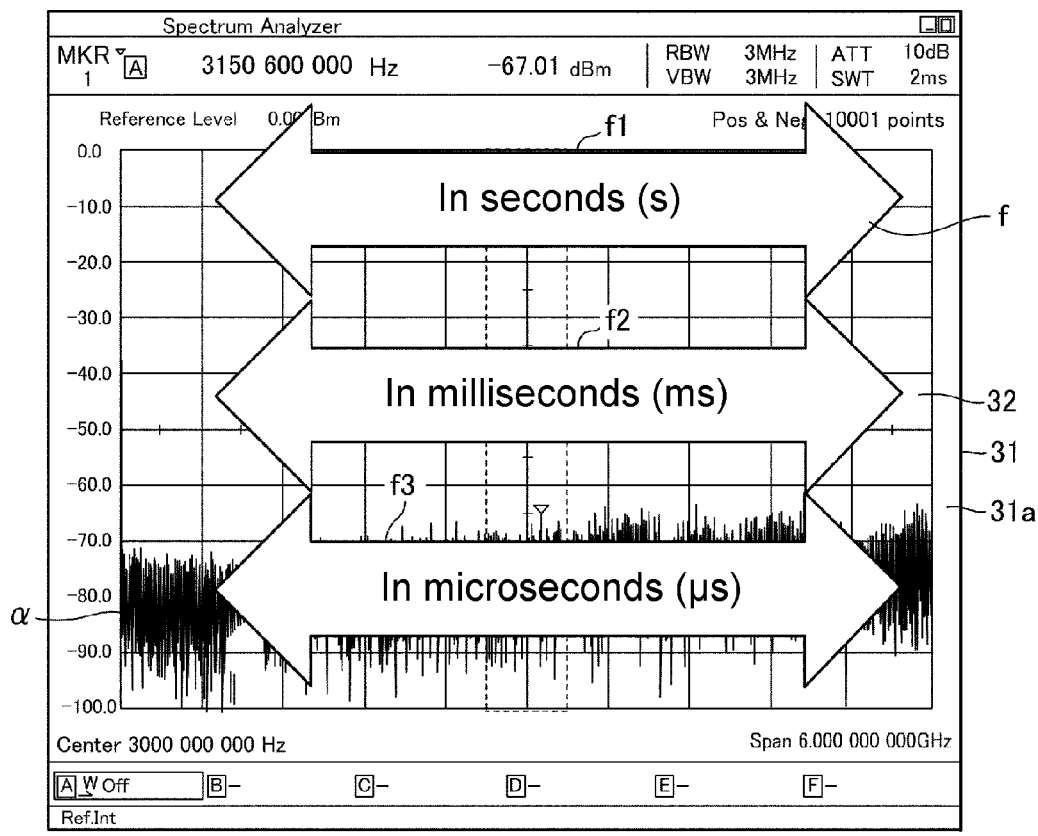
FIG. 8 is a diagram illustrating an example of the detailed display of a fourth analysis menu selection image in the signal processing device according to the first embodiment of the invention.

FIG. 8 shows an example of the detailed display of the fourth analysis menu selection image f. The fourth analysis menu selection image f includes first to third horizontally long operation switches f1 to f3 for displaying, as a menu, the processing parameters with three different measurement time units, that is, a second (s), a milliseconds (ms), and a microsecond (μs), and is connected with the touch panel 32.

When any one of the first to third operation switches f1 to f3 is touched and slid in the left direction (one direction), the touch panel 32 outputs any one of the positional information items K28, K30, and K32 to instruct a corresponding function among the functions A in the table.

When any one of the first to third operation switches f1 to f3 is touched and slid in the right direction (the other direction), the touch panel 32 outputs any one of the positional information items K29, K31, and K33 to instruct a corresponding function among the functions B in the table.

A position signal output from the touch panel 32 is a few bits of digital signal including a combination of the address of the touch position in the row direction and the address of the touch position in the column direction when touch sensors are arranged in a matrix in the touch panel 32.

The control unit 50 includes a central processing unit (CPU) or a microprocessor. The control unit 50 receives a plurality of bits of positional information from the touch panel 32 through the input terminal X and temporarily stores the positional information in a shift register (not shown).

As shown in FIG. 1, the control unit 50 reads the program stored in the ROM 41 to implement the functions of six functional blocks, that is, a toggle switch image output unit 51, a display mode selection image output unit 52, an analysis menu selection image output unit 53, a processing parameter output unit 54, a branch processing unit 55, and an analysis menu selection image deletion unit 56.

First, the control unit 50 operates the toggle switch image output unit 51 when the signal processing device 1 starts or when a predetermined button is turned on. This operation corresponds to Step S01 in the operation flow of the control unit 50 shown in FIG. 9.

The toggle switch image output unit 51 displays only the toggle switch image a. The toggle switch image output unit 51 reads data for the toggle switch image a from the display image data table 43, outputs the data to the display unit 31, and performs control such that the toggle switch image a is constantly displayed on the display screen 31a, as shown in FIGS. 2(a) to 2(f).

The toggle switch image output unit 51 displays the toggle switch image a using a layer that is closer to the surface than the graph α of the display screen 31a. The toggle switch image a is displayed at a predetermined position where it does not overlap, for example, the graph α or scales. For example, the toggle switch image a is translucently displayed at the upper right corner.

When the toggle switch image output unit 51 outputs the data for the toggle switch image a to the display unit 31, the control unit 50 switches to the toggle switch image output unit 51 and operates the display mode selection image output unit 52. The operation of the display mode selection image output unit 52 corresponds to Steps S02 and S03 in the operation flow of the control unit 50 shown in FIG. 9.

The display mode selection image output unit 52 displays the display mode selection image b on the display unit 31 if the positional information K1 is input. The positional information K1 corresponds to the toggle switch image a displayed on the display screen 31a and is generated when the operator touches the touch panel 32.

The display mode selection image output unit 52 watches the positional information output from the touch panel 32 being input to the shift register through the input terminal X of the control unit 50. When the positional information is input, the display mode selection image output unit 52 checks whether the positional information is K1.

When it is checked that the positional information K1 is input, the display mode selection image output unit 52 selects and reads data for the display mode selection image b from the display image data table 43 and outputs the data to the display unit 31 such that the display mode selection image b is displayed on a layer that is closer to the surface than the graph α, as shown in FIG. 2(b). It is preferable that the display mode selection image b be translucently displayed.

When the data for the display mode selection image b is output to the display unit 31, the control unit 50 switches to the display mode selection image output unit 52 and operates the analysis menu selection image output unit 53. The operation of the analysis menu selection image output unit 53 corresponds to Steps S04 to S07 in the operation flow of the control unit 50 shown in FIG. 9.

The analysis menu selection image output unit 53 deletes the display mode selection image b displayed on the display screen 31a on the condition that any one of the positional information items K2 to K5 is input and displays one of data items for the analysis menu selection images c, d, e, and f, for example, on the same layer of the display screen 31a as that from which the display mode selection image b is deleted.

The positional information items K2 to K5 correspond to any one of the first to fourth selection buttons b1 to b4 for displaying analysis menu items in the display mode selection image b displayed on the display screen 31a and are generated when the operator touches the touch panel 32.

The analysis menu selection image output unit 53 watches any one of the positional information items K2 to K5 being input to the shift register through the input terminal X of the control unit 50. When the positional information is input, the analysis menu selection image output unit 53 checks the positional information to determine the analysis menu selection image corresponding to the positional information in the display mode selection image b.

The analysis menu selection image output unit 53 specifies the analysis menu selection image corresponding to the positional information in the display mode selection image b using a check operation, updates the positional information corresponding to the specified analysis menu selection image, and stores the updated positional information.

Specifically, when it is checked that any one of the positional information items K2 to K5 corresponds to the specified analysis menu selection image, the analysis menu selection image output unit 53 updates the positional information, stores the positional information in the RAM 42, and deletes the display mode selection image b. The positional information which is updated and stored in the RAM 42 is used to determine the output destination of the processing parameters, which will be described below.

Then, the analysis menu selection image output unit 53 reads one of the data items for the analysis menu selection images c, d, e, and f corresponding to any one of the positional information items K2 to K5 from the display image data table 43, outputs the read data to the display unit 31, and displays the read analysis menu selection image on the layer that is closer to the surface than the graph α displayed on the display screen 31a.

When any one of the analysis menu selection images c, d, e, and f is output to the display unit 31, the control unit 50 switches to the analysis menu selection image output unit 53 and operates the processing parameter output unit 54. The operation of the processing parameter output unit 54 corresponds to Steps S08 to S10 in the operation flow of the control unit 50 shown in FIG. 9.

If the positional information corresponding to a predetermined slide touch is input from the touch panel 32, the processing parameter output unit 54 reads the processing parameter corresponding to the positional information from the parameter data table 44 and outputs the processing parameter to the corresponding center frequency setting unit 22, the corresponding frequency span setting unit 23, the corresponding amplitude level setting unit 25, or the corresponding measurement time setting unit 26 in the processing parameter setting unit 21 such that the change value corresponding to a slide touch direction included in the positional information is increased or decreased with respect to the currently set value.

The association between the image displayed on the display screen 31a and the touch panel 32 has been described above with reference to FIGS. 2 and 3. However, when the analysis menu selection image c is displayed on the display screen 31a, any one of the positional information items K6 to K13 which corresponds to a slide touch operation for any one of the first to fourth operation switches c1 to c4 in the left or right direction is generated. When the analysis menu selection image d is displayed, any one of the positional information items K14 to K21 which corresponds to a slide touch operation for any one of the first to fourth operation switches d1 to d4 in the left or right direction is generated. When the analysis menu selection image e is displayed, any one of the positional information items K22 to K27 which corresponds to a slide touch operation for any one of the first to third operation switches e1 to e3 in the upper or lower direction is generated. When the analysis menu selection image f is displayed, any one of the positional information items K28 to K33 which corresponds to a slide touch operation for any one of the first to third operation switch f1 to f3 in the left or right direction is generated.

The processing parameter output unit 54 watches any one of the positional information items being input to the shift register through the input terminal X of the control unit 50. When the positional information is input, the processing parameter output unit 54 checks the positional information items K6 to K13, K14 to K21, K22 to K27, or K28 to K33 of the parameter setting item corresponds to the input positional information.

As the check result, when the input positional information is not identical to other positional information, the processing parameter output unit 54 deletes the positional information input to the shift register and watches until the next positional information is input.

When it is checked that the input positional information corresponds to any one of the positional information items K6 to K13, K14 to K21, K22 to K27, or K28 to K33, the processing parameter output unit 54 reads the processing parameter corresponding to the positional information from the parameter data table 44 and outputs the processing parameter to the corresponding setting unit 22, 23, 25, or 26 in the processing parameter setting unit 21.

In this case, the positional information corresponding to the analysis menu selection image which is updated and stored in the operation of the analysis menu selection image output unit 53 is used to determine the output destination of the processing parameter.

The processing parameter output unit 54 may output the processing parameter read from the parameter data table 44 to a predetermined setting unit, without any change, or it may output the product of a value obtained by measuring and digitizing a slide touch stroke and the processing parameter.

When the processing parameter output unit 54 outputs the processing parameter, the control unit 50 switches to the processing parameter output unit 54 and operates the branch processing unit 55. The operation of the branch processing unit 55 corresponds to Step S11 in the operation flow of the control unit 50 shown in FIG. 9.

In the display state shown in FIG. 2(c), 2(d), 2(e), or 2(f), if any one of the positional information items K1 to K33 is input, the branch processing unit 55 determines whether to return the operation to the processing parameter output unit 54 or to move the operation to the analysis menu selection image deletion unit 56.

Specifically, when any one of the positional information items K6 to K33 is input, that is, when a slide touch operation is performed for the operation switches c1 to c4, d1 to d4, e1 to e3, and f1 to f3 in Step S12, the branch processing unit 55 returns the operation of the processing parameter output unit 54 to Step S09.

As described above, in the display state shown in FIG. 2(c), 2(d), 2(e), or 2(f), the operator can performs a slide touch operation for the operation switches c1 to c4, d1 to d4, e1 to e3, and f1 to f3 in the displayed analysis menu selection images c, d, e, or f any number of times. Therefore, the operations of the processing parameter output unit 54 and the branch processing unit 55 are endlessly repeated. A slide touch operation can be repeatedly performed for the analysis menu items with the same resolution or different resolutions any number of times to sequentially read the processing parameters with the same resolution or different resolutions from the parameter data table 44 and to output the processing parameters to each setting unit 22, 23, 25, or 26 of the corresponding processing parameter setting unit 21. Therefore, it is possible to intensively control a change in the display mode for the center frequency, frequency span, and amplitude level of the graph α and a change in the measurement time in the same line of sight as that to the graph α.

When the positional information K1 is input, with the analysis menu selection image c, d, e, or f shown in FIG. 2(c), 2(d), 2(e), or 2(f) being displayed, that is, when a touch operation is performed for the toggle switch image a, the branch processing unit 55 moves the operation to the analysis menu selection image deletion unit 56. The operation of the analysis menu selection image deletion unit 56 corresponds to Step S12 in the operation flow of the control unit 50 shown in FIG. 9.

The analysis menu selection image deletion unit 56 outputs a signal for deleting the analysis menu selection images c, d, e, and f displayed on the display unit 31 to the display unit 31.

Then, only the graph α in the changed display mode can be displayed on the display screen 31a on the basis of the processing parameters.

Next, the overall operation of the signal processing device 1 will be described with reference to FIG. 1, FIG. 2, FIG. 3, and FIG. 9.

When the signal processing device 1 starts, the signal analysis unit 10 sets the measurable frequency range (frequency band) of the input signal S as the signal to be measured, on the basis of the processing parameters and performs signal processing to obtain a desired frequency spectrum waveform. The display unit 31 receives the graph display signal output from the signal analysis unit 10 and displays the graph α of the frequency spectrum waveform on the display screen 31a. In this case, the center frequency setting unit 22, the frequency span setting unit 23, and the amplitude level setting unit 25 set the center frequency, the frequency span, and the amplitude level on the basis of the processing parameters which are updated and stored when the previous operation ends. The RBW setting unit 24 sets the RBW on the basis of the initial value and the graph α of the frequency spectrum waveform in which the setting is reflected is displayed on the display screen 31a.

At that time, the measurement time setting unit 26 sets the sweep time on the basis of the processing parameter which is updated and stored when the previous operation ends and the local signal which is oscillated by the local oscillator 12 is controlled.

When the signal processing device 1 starts, the control unit 50 reads the program from the ROM 41 to implement the functions of six functional blocks, that is, the toggle switch image output unit 51, the display mode selection image output unit 52, the analysis menu selection image output unit 53, the processing parameter output unit 54, the branch processing unit 55, and the analysis menu selection image deletion unit 56. First, the control unit 50 operates the toggle switch image output unit 51.

The toggle switch image output unit 51 reads data for the toggle switch image a in the display image data table 43 and outputs the data to the display unit 31 such that the toggle switch image a is constantly displayed on the display screen 31a, as shown in FIG. 2(a) (Step S01).

When the operator wants to change the display mode of the graph α and touches the toggle switch image a, the display mode selection image b is displayed on the display screen 31a, as shown in FIG. 2(b). When the operator touches any one of the first to fourth selection buttons b1 to b4, any one of the analysis menu selection images c, d, e, and f is displayed on the display screen 31a, as shown in FIGS. 2(c) to 2(f). Then, the operator touches and slides any one of a plurality of selection switches (c1 to c4, d1 to d4, e1 to e3, and f1 to f3) in the displayed analysis menu selection image. Then, the signal processing device 1 outputs the processing parameters with the same resolution or different resolutions for any one of the center frequency, the frequency span, the amplitude level, and the measurement time corresponding to the slide touch to a corresponding setting unit among the center frequency setting unit 22, the frequency span setting unit 23, the amplitude level setting unit 25, and the measurement time setting unit 26 and updates the settings of the processing parameters. Therefore, the signal analysis unit 10 performs signal processing for the input signal S as the signal to be measured on the basis of the updated processing parameter to obtain a desired frequency spectrum waveform and the graph α displayed on the display unit 31 is changed to a desired state.

Figure 9:
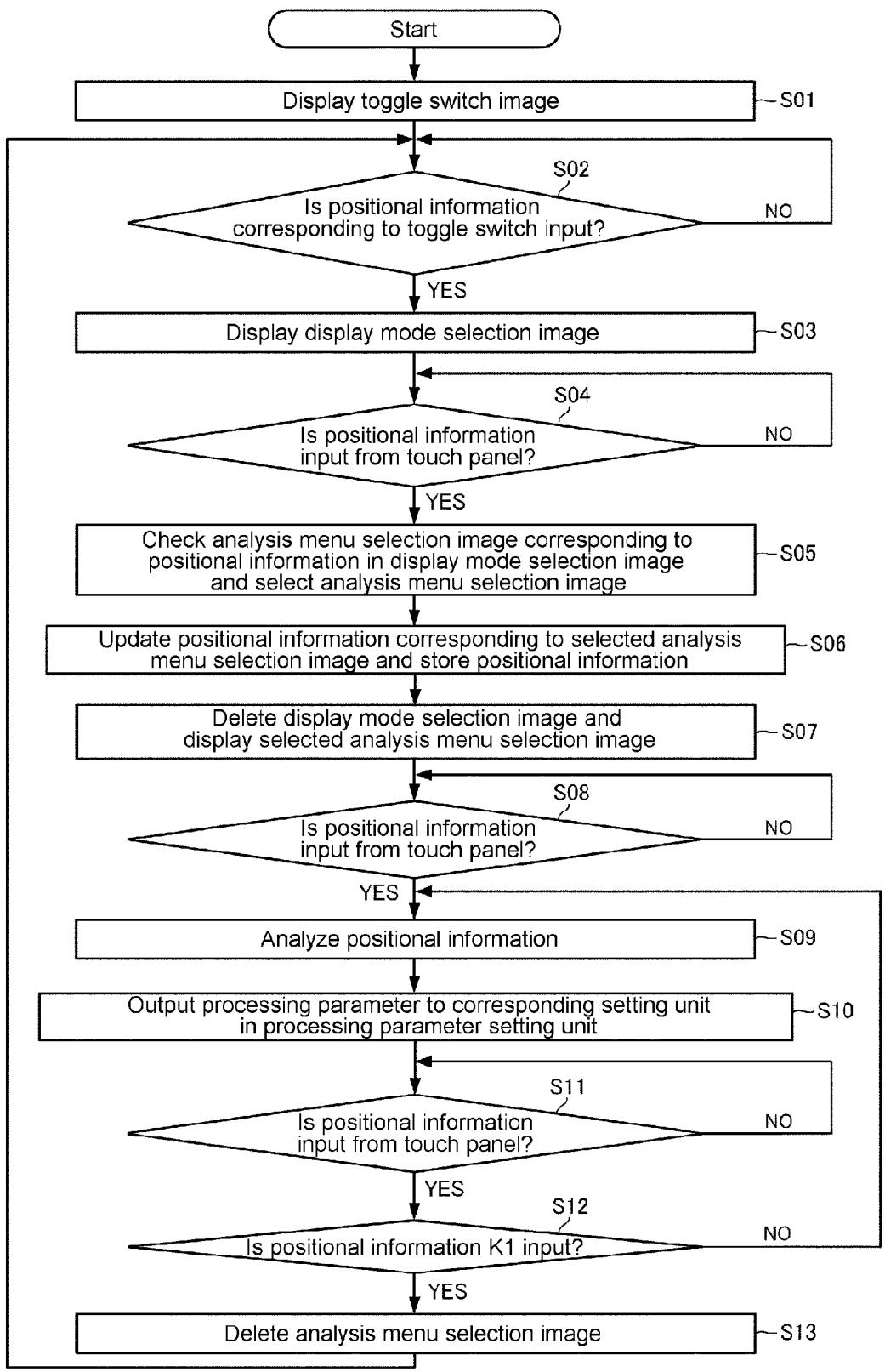
FIG. 9 is a flowchart illustrating the operation of a control unit of the signal processing device according to the first embodiment of the invention.

Next, the operation of the control unit 50 will be described with reference to the flowchart shown in FIG. 9.

First, the control unit 50 operates the display mode selection image output unit 52. The display mode selection image output unit 52 determines whether the positional information K1 is input and performs this determination process until the positional information K1 is input (until the determination result is "YES") (Step S02). When the positional information K1 is input, the display mode selection image output unit 52 selects data for the display mode selection image b in the display image data table 43, reads the data, and outputs the data to the display unit 31. Then, as shown in FIG. 2(*b*), the display mode selection image b is displayed on the layer that is closer to the surface than the graph α (Step S03).

Then, the control unit 50 operates the analysis menu selection image output unit 53. The analysis menu selection image output unit 53 determines whether any one of the positional information items K2 to K5 is input and performs this determination process until any one of the positional information items K2 to K5 is input (until the determination result is "YES") (Step S04). When any one of the positional information items K2 to K5 is input, the analysis menu selection image output unit 53 checks the positional information to determine an analysis menu selection image corresponding to the input positional information in the display mode selection image b (Step S05). Then, the analysis menu selection image output unit 53 updates the positional information corresponding to the selected analysis menu selection image and stores the updated positional information (Step S06). Then, the analysis menu selection image output unit 53 deletes the display mode selection image b, reads one of data items for the analysis menu selection images c, d, e, and f corresponding to any one of the positional information items K2 to K5 from the display image data table 43, and outputs the data to the display unit 31. Then, the selected analysis menu selection image is displayed on the layer that is closer to the surface than the graph α displayed on the display screen 31*a* (Step S07).

Then, the control unit 50 operates the processing parameter output unit 54. The processing parameter output unit 54 determines whether any one of the positional information items K6 to K33 is input on the basis of a slide touch and performs this determination process until the positional information is input (until the determination result is "YES") (Step S08). When the positional information is input, the processing parameter output unit 54 analyzes the positional information and determines an analysis menu selection image (c, d, e, or f) and an operation switch (c1 to c4, d1 to d4, e1 to e3, or f1 to f3) which correspond to the positional information. In addition, the processing parameter output unit 54 determines whether a slide touch is performed in one direction or the other direction (Step S09). Then, the processing parameter output unit 54 reads the processing parameter of a menu item corresponding to the specified analysis menu selection image from the parameter data table 44 and outputs the processing parameter to the setting unit 22, 23, 25, or 26 corresponding to the positional information in the processing parameter setting unit 21 (Step S10).

Then, the control unit 50 operates the branch processing unit 55. The branch processing unit 55 determines whether any one of the positional information items K1 and K6 to K33 is input in the display state shown in FIG. 2(*c*), 2(*d*), 2(*e*), or 2(*f*) and performs this determination process until the positional information K1 is input (until the determination result is "YES") (Step S11). When the positional information is input, the branch processing unit 55 determines whether the positional information K1 is input or any one of the positional information items K6 to K33 is input. When any one of the positional information items K6 to K33 is input, the branch processing unit 55 determines to return the operation to the processing parameter output unit 54. When the positional information K1 is input, the branch processing unit 55 determines to move the operation to the analysis menu selection image deletion unit 56 (Step S12).

When the branch processing unit 55 determines that any one of the positional information items K6 to K33 is input (NO in Step S12), the control unit 50 operates the processing parameter output unit 54. Then, when the operator selects a desired operation switch among a plurality of operation switches (c1 to c4, d1 to d4, e1 to e3, and f1 to f3) in one analysis menu selection image (c, d, e, or f) and touches and slides the selected operation switch any number of times, it is possible to repeatedly output the processing parameters with the same resolution or different resolutions to the corresponding setting units 22, 23, 25, and 26. As a result, it is possible to largely and minutely change the center frequency, the frequency span, the amplitude level, and the measurement time in the graph α displayed on the display unit 31 only by repeatedly performing a slide touch in the same line of sight, while observing a change in the graph α.

When the branch processing unit 55 determines that the positional information K1 is input (the toggle switch image a is touched) (YES in Step S12), the control unit 50 operates the analysis menu selection image deletion unit 56. The analysis menu selection image deletion unit 56 outputs a signal for deleting the analysis menu selection image displayed on the display unit 31 to the display unit 31 (Step S13). In this way, it is possible to display the graph α without being covered by the analysis menu selection image.

When the operator wants to change the type of processing parameter to change the graph α, specifically, when the operator wants to change a graph-changeable state in which the center frequency shown in FIG. 2(*c*) can be changed to a graph-changeable state in which the frequency span shown in FIG. 2(*d*) can be changed, a graph-change state in which the amplitude level shown in FIG. 2(*e*) can be changed, or a state in which the measurement time shown in FIG. 2(*f*) can be changed, the operator touches the toggle switch image a to delete the analysis menu selection image c displayed on the display screen 31*a*, touches the toggle switch image a again to display the display mode selection image b on the display screen 31*a*, and touches the second selection button b2, the third selection button b3, or the fourth selection button b4 in the display mode selection image b to display the second analysis menu selection image d shown in FIG. 2(*d*), the third analysis menu selection image e shown in FIG. 2(*e*), or the fourth analysis menu selection image f shown in FIG. 2(*f*).

In this way, the signal processing device 1 according to this embodiment has the following advantages.

(1) The user (operator) can change the display of a graph as a signal analysis state, without performing a complicated operation.

(2) The user can move the entire measurable frequency band with a simple finger operation (a tap (touch) operation or a click (slide touch) operation). Therefore, even when the user is not familiar with the operation of the signal analysis device, the user can move the entire measurable frequency band.

(3) The designation of the amount of movement (unit resolution) of the entire measurable frequency band by one operation and the moving direction of the entire measurable frequency band can be set by only a series of movements of the finger. Therefore, the operation is simplified.

(4) The user can change the display of the signal analysis state while viewing the display of the display unit. Therefore, the operation of other switches, buttons, or encoders is not needed and the burden of the user is reduced.

(5) The amount of movement (unit resolution) of the entire measurable frequency band by one operation can be selected from 1 Hz, 1 kHz, 1 MHz, and 1 GHz and then set to the selected value. Therefore, it is possible to perform both rough adjustment and fine adjustment.

(6) The user can change the display of the graph as a signal analysis state, without performing a complicated operation.

(7) The user can convert the width of the entire measurable frequency band with a simple finger operation (a pinch-in operation or a pinch-out operation). Therefore, the user who is not familiar with the operation of the signal analysis device can change the width of the entire measurable frequency band.

(8) The user can set the designation of the amount of change in the width of the entire measurable frequency band by one operation and the designation of whether to widen or narrow the width of the entire measurable frequency band with a series of movements of the finger. Therefore, the operation is simplified.

(9) Since the user can change the display of the signal analysis state while viewing the display of the display unit. Therefore, the operation of other switches, buttons, or encoders is not needed and the burden of the user is reduced.

(10) The amount of increase in the width of the entire measurable frequency band by one operation can be selected from 1 Hz, 1 kHz, 1 MHz, and 1 GHz and then set to the selected value. Therefore, it is possible to perform both rough adjustment and fine adjustment.

In the first embodiment, the display mode selection image b for selecting the first to fourth analysis menu selection images c to f is provided. However, the invention is not limited thereto. For example, the display of the display mode selection image b may be omitted.

The following second embodiment relates to an example in which the display of the display mode selection image b is omitted.

Second Embodiment

The second embodiment of the invention will be described with reference to FIG. 10. In the second embodiment, the same components as those in the first embodiment are denoted by the same reference numerals and the structure, operation, and effect of the second embodiment will be described with a focus on different components.

Figure 10:
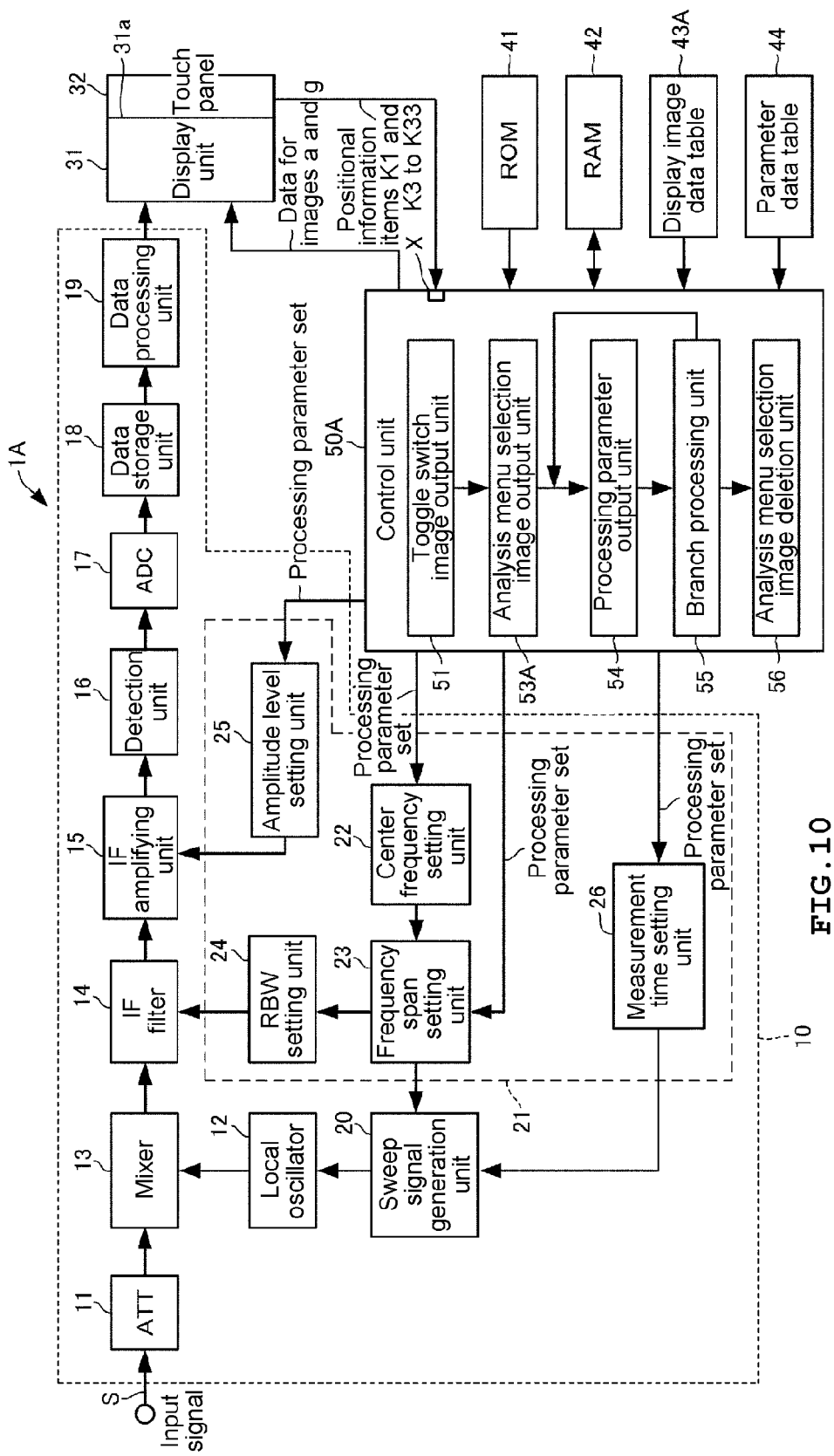
FIG. 10 is a functional block diagram illustrating a signal processing device according to a second embodiment of the invention.

As shown in FIG. 10, a signal processing device 1A according to this embodiment includes a signal analysis unit 10, a display unit 31, a touch panel 32, a control unit 50A, a ROM 41, a RAM 42, a display image data table 43A, and a parameter data table 44.

Figure 11:
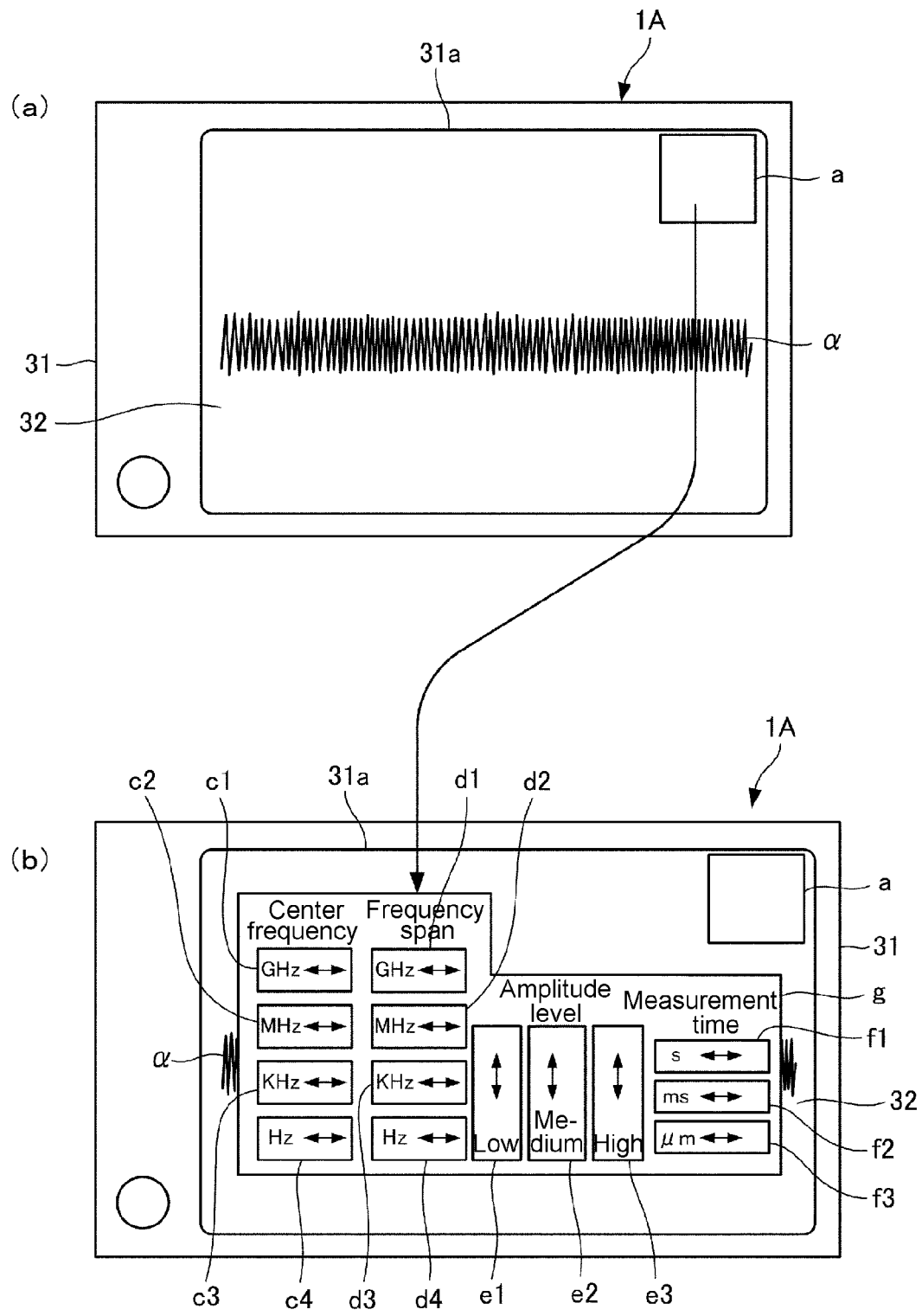
FIG. 11 is a transition diagram illustrating the display state of a display unit of the signal processing device according to the second embodiment of the invention.

As shown in a transition diagram of FIG. 11, the display image data table 43A stores data for displaying two images, that is, a toggle switch image a and an analysis menu selection image g.

The control unit 50A includes a toggle switch image output unit 51, an analysis menu selection image output unit 53A, a processing parameter output unit 54, a branch processing unit 55, and an analysis menu selection image deletion unit 56. In this structure, the control unit 50A does not include the display mode selection image output unit 52 according to the first embodiment.

When the toggle switch image output unit 51 outputs data for a toggle switch image a to the display unit 31, the control unit 50A switches to the toggle switch image output unit 51 and operates the analysis menu selection image output unit 53A. The operation of the analysis menu selection image output unit 53A corresponds to Steps S22 to S26 in the operation flow of the control unit 50A shown in FIG. 12.

The analysis menu selection image output unit 53A directs an analysis menu selection image g on the display unit 31 if positional information K1 is input.

The analysis menu selection image output unit 53A watches the positional information K1 from the touch panel 32 being input to a shift register through an input terminal X of the control unit 50A. When the positional information is input, the analysis menu selection image output unit 53A checks whether the positional information is K1. When it is checked that the positional information K1 is input, the analysis menu selection image output unit 53A selects data for the analysis menu selection image g in the display image data table 43A, reads the data, and outputs the data to the display unit 31 such that the analysis menu selection image g is displayed on the layer that is closer to the surface than a graph α, as shown in FIG. 11(b).

The signal processing device 1A is configured such that the toggle switch image a is constantly displayed on a display screen 31a, the analysis menu selection image g is displayed when the toggle switch image a is touched, and the analysis menu selection image g is deleted when the toggle switch image a is touched again, as shown in the transition diagram shown in FIG. 11.

The operation switches c1 to c4, d1 to d4, e1 to e3, and f1 to f3 of the analysis menu selection images c, d, e, and f shown in the display state transition diagram of FIG. 2 in the first embodiment are collectively displayed in the analysis menu selection image g on the display screen 31a.

The user touches and slides a desired operation switch among the operation switches c1 to c4, d1 to d4, e1 to e3, and f1 to f3 to change any one of a center frequency, a frequency span, an amplitude level, and a measurement time for the display mode of the graph α.

Then, similarly to the control unit 50 according to the first embodiment, the control unit 50A reads a corresponding processing parameter among a plurality of processing parameters stored in the parameter data table 44 and outputs the processing parameter to a corresponding setting unit among a center frequency setting unit 22, a frequency span setting unit 23, an amplitude level setting unit 25, and a measurement time setting unit 26 in the processing parameter setting unit 21 of the signal analysis unit 10. In this way, it is possible to change one of the center frequency, the frequency span, the amplitude level, and the measurement time related to the display mode of the graph α which corresponds to the desired slide touch.

Figure 12:
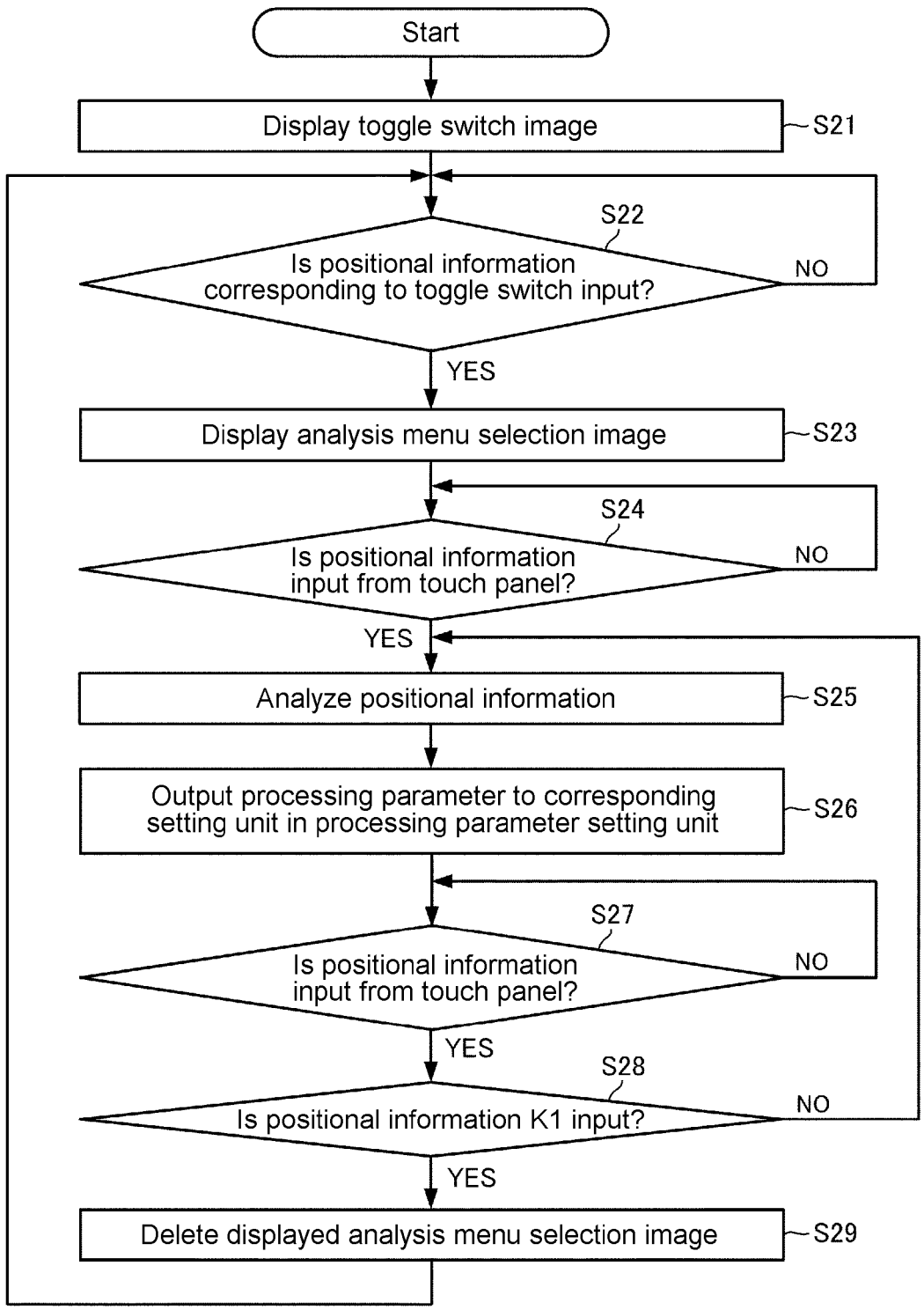
FIG. 12 is a flowchart illustrating the operation of a control unit of the signal processing device according to the second embodiment of the invention.

Next, the operation flow of the control unit 50A shown in FIG. 12 will be described briefly.

First, the control unit 50A operates the toggle switch image output unit 51 to display the toggle switch image a on the display screen 31a (Step S21). The control unit 50A operates the analysis menu selection image output unit 53A. The analysis menu selection image output unit 53A determines whether the positional information K1 is input and performs this determination process until the toggle switch image a is touched and the positional information K1 is input (until the determination result is "YES") (Step S22). When the positional information K1 is input, the analysis menu selection image output unit 53A selects data for the analysis menu selection image g in the display image data table 43A, reads the data, and outputs the data to the display unit 31 such that the analysis menu selection image g is displayed on the layer that is closer to the surface than the analysis menu selection image g, as shown in FIG. 11(b) (Step S23).

Then, the control unit 50A operates the processing parameter output unit 54. The processing parameter output unit 54 determines whether any one of the positional information items K6 to K33 is input on the basis of the slide touch shown in the table of FIG. 3 and performs this determination process until the positional information is input (until the determination result is "YES") (Step S24). When the positional information is input, the processing parameter output unit 54 analyzes the positional information and determines one of the operation switches (c1 to c4, d1 to d4, e1 to e3, f1 to f3) in the analysis menu selection images (c, d, e, and f) which corresponds to the positional information. In addition, the processing parameter output unit 54 determines whether the slide touch is performed in one direction or the other direction (Step S25). Then, the processing parameter output unit 54 reads the processing parameter of the menu item corresponding to the specified analysis menu selection image from the parameter data table 44 and outputs the processing parameter to the setting unit 22, 23, 25, or 26 corresponding to the positional information in the processing parameter setting unit 21 (Step S26).

Then, the control unit 50A operates the branch processing unit 55. The branch processing unit 55 determines whether any one of the positional information items K1 and K6 to K33 is input in the display state shown in FIG. 11(*b*) and performs this determination process until the positional information K1 is input (until the determination result is "YES") (Step S27). When the positional information is input, the branch processing unit 55 determines whether the positional information K1 is input or any one of the positional information items K6 to K33 is input. When any one of the positional information items K6 to K33 is input, the branch processing unit 55 returns the operation to the processing parameter output unit 54. When the positional information K1 is input, the branch processing unit 55 moves the operation to the analysis menu selection image deletion unit 56 (Step S28).

When the branch processing unit 55 determines that any one of the positional information items K6 to K33 is input (NO in Step S28), the control unit 50A operates the processing parameter output unit 54. In this way, when the user selects a desired operation switch among a plurality of operation switches (c1 to c4, d1 to d4, e1 to e3, and f1 to f3) in one analysis menu selection image (c, d, e, or f) and touches and slides the selected operation switch any number of times, it is possible to repeatedly output the processing parameters with the same resolution or different resolutions to the corresponding setting units 22, 23, 25, and 26. As a result, it is possible to largely and minutely change the center frequency, the frequency span, the amplitude level, and the measurement time in the graph α displayed on the display unit 31 only by repeatedly performing a slide touch in the same line of sight, while observing a change in the graph α.

When the branch processing unit 55 determines that the positional information K1 is input (the toggle switch image a is touched) (YES in Step S28), the control unit 50A operates the analysis menu selection image deletion unit 56. The analysis menu selection image deletion unit 56 outputs a signal for deleting the analysis menu selection image displayed on the display unit 31 to the display unit 31 (Step S29). In this way, it is possible to display the graph α without being covered by the analysis menu selection image.

Other Embodiments

The invention is not limited to the above-described embodiments, but the scope of the claims includes various changes in the design which are made without departing from the scope and spirit of the invention.

For example, in the above-described embodiments, the processing parameters related to the center frequency, the frequency span, the amplitude level, and the measurement time are set. However, a processing parameter related to the RBW may also be set. In addition, a processing parameter related to the sweep speed of the sweep signal generation unit 20 or the attenuation rate of the ATT 11 may be set.

In the first and second embodiments, the toggle switch image a is displayed so as to be visible. However, the invention is not limited thereto. For example, the toggle switch image a may be displayed if the operator touches any portion of the touch panel 32.

In the first and second embodiments, the control unit 50 or 50A reads one of the processing parameters related to the center frequency, the frequency span, the amplitude level, and the measurement time from the parameter data table 44 and outputs the processing parameter to the processing parameter setting unit. However, the invention is not limited thereto. The control unit 50 or 50A may read a plurality of processing parameters on the basis of a plurality of slide touches and output the plurality of processing parameters to the processing parameter setting unit at the same time.

In addition, the display state (for example, brightness) of, for example, the toggle switch image a may be changed in stages. Alternatively, the display state may be changed depending on the degree of skill of the operator of the signal processing device. For example, the entire toggle switch image a is displayed or only the frame of the toggle switch image a is displayed.

In the usage environment in which the operator knows the position of the toggle switch image a, the toggle switch image a may not be displayed on the display screen 31*a* of the display unit 31. Alternatively, when the operator touches the touch panel 32, the toggle switch image a may be displayed only in a predetermined time.

In the above-described embodiments, the analysis menu selection image is used to set the center frequency, to change the frequency span, to change the amplitude level, or to change the measurement time. However, the invention is not limited thereto. For example, the analysis menu selection image may be used to change the end frequency of the frequency band while pressing the start frequency or to change the start frequency of the frequency band while pressing the end frequency.

In the signal processing devices 1 and 1A, the control units 50 and 50A may have, for example, a function of setting the amount of attenuation of the ATT 11 or a function of setting the oscillating frequency of the local oscillator 12. In addition, an operation unit for setting the amount of attenuation of the ATT 11 or the oscillating frequency of the local oscillator 12 may be provided and the processing parameter which is set by the operator using the operation unit and the processing parameters in the parameter data table 44 may be switched using the analysis menu selection image.

The signal processing devices and a signal processing method according to the invention can aggregate operations for setting the frequency resolutions on the display screen in an integrated fashion and enable the user to rapidly repeat an operation for changing to the same resolution or a different resolution and an operation for changing the display mode of the graph with the change in the resolution with a fingertip touch in a line of sight to the displayed graph. The signal processing devices and a signal processing method according to the invention are generally used for a signal processing device, such as a spectrum analyzer, and a signal processing method.

DESCRIPTION OF REFERENCE NUMERALS AND SIGNS 1, 1A: SIGNAL PROCESSING DEVICE
10: SIGNAL ANALYSIS UNIT (SIGNAL PROCESSING MEANS)
22: CENTER FREQUENCY SETTING UNIT (PROCESSING PARAMETER SETTING UNIT)
23: FREQUENCY SPAN SETTING UNIT (PROCESSING PARAMETER SETTING UNIT)
25: AMPLITUDE LEVEL SETTING UNIT (PROCESSING PARAMETER SETTING UNIT)
26: MEASUREMENT TIME SETTING UNIT (PROCESSING PARAMETER SETTING UNIT)
31: DISPLAY UNIT (DISPLAY MEANS)
31a: DISPLAY SCREEN
32: TOUCH PANEL
43, 43A: DISPLAY IMAGE DATA TABLE
44: PARAMETER DATA TABLE
50, 50A: CONTROL UNIT (CONTROL MEANS)
51: TOGGLE SWITCH IMAGE OUTPUT UNIT
52: DISPLAY MODE SELECTION IMAGE OUTPUT UNIT
53, 53A: ANALYSIS MENU SELECTION IMAGE OUTPUT UNIT
54: PROCESSING PARAMETER OUTPUT UNIT
55: BRANCH PROCESSING UNIT
56: ANALYSIS MENU SELECTION IMAGE DELETION UNIT
S: INPUT SIGNAL
α: GRAPH
a: TOGGLE SWITCH IMAGE
b: DISPLAY MODE SELECTION IMAGE
c, d, e, f, g: ANALYSIS MENU SELECTION IMAGE
K1 to K33: POSITIONAL INFORMATION
S02, S22: TOUCH OPERATION SPECIFICATION STEP
S10, S26: PARAMETER OUTPUT STEP
S11, S12, S27, S28: BRANCH STEP
S13, S29: ANALYSIS MENU SELECTION IMAGE DELETION STEP

What is claimed is:

1. A signal processing device comprising:
signal processing means that includes a processing parameter setting unit, performs a predetermined process for an input signal on the basis of a processing parameter set by the processing parameter setting unit, and outputs a graph display signal for displaying a graph in which a horizontal axis is a frequency and a vertical axis is an amplitude level;
display means for receiving the graph display signal output from the signal processing means and displaying the graph on a display screen;
a parameter data table that stores the processing parameter set;
control means for reading at least one processing parameter from the parameter data table and outputting the processing parameter to the processing parameter setting unit; and
a touch panel that is provided so as to correspond to the display screen and includes a touch sensor which outputs positional information associated with a touch operation,
wherein the parameter data table stores a plurality of the processing parameters with different resolutions corresponding to each positional information item,
the control means includes a processing parameter output unit that reads the processing parameters with different resolutions corresponding to the positional information from the parameter data table and outputs the processing parameters to the processing parameter setting unit, if the positional information is input from the touch panel, and
the processing parameter output unit of the control means reads at least one change value as the processing parameter corresponding to the positional information from the parameter data table and outputs the change value to the processing parameter setting unit such that the change value is increased or decreased with respect to a currently set value in correspondence with a slide touch direction included in the positional information.

2. The signal processing device according to claim 1, wherein the processing parameter setting unit includes at least one of a center frequency setting unit that sets a center frequency of the graph, a frequency span setting unit that sets a frequency span of the graph, an amplitude level setting unit that sets an amplitude level of the graph, and a measurement time setting unit that sets a measurement time of the input signal,
the parameter data table stores a plurality of center frequency change values with different resolutions at which the center frequency is changed, a plurality of frequency span change values with different resolutions at which the frequency span is changed, a plurality of amplitude level change values with different resolutions at which the amplitude level is changed, or a plurality of measurement time change values with different resolutions at which the measurement time is changed, as the processing parameters which are stored so as to correspond to the center frequency setting unit, the frequency span setting unit, the amplitude level setting unit, or the measurement time setting unit in the processing parameter setting unit, and
the processing parameter output unit reads, as the processing parameter corresponding to the positional information, one of the center frequency change values, one of the frequency span change values, one of the amplitude level change values, or one of the measurement time change values from the parameter data table and outputs the read change value to the corresponding center frequency setting unit, the corresponding frequency span setting unit, the corresponding amplitude level setting unit, or the corresponding measurement time setting unit in the processing parameter setting unit such that the change value is increased or decreased with respect to the currently set value in correspondence with the slide touch direction included in the positional information.

3. The signal processing device according to claim 1, wherein the control means further includes:
an analysis menu selection image output unit that reads data for an analysis menu selection image corresponding to predetermined positional information from a display image data table and outputs the data such that the analysis menu selection image is displayed on the display screen, if the predetermined positional information is input from the touch panel;
a branch processing unit that returns an operation to the processing parameter output unit if positional information corresponding to one parameter setting item is input from the touch panel, with the analysis menu selection image displayed on the display screen; and an analysis menu selection image deletion unit that deletes the analysis menu selection image displayed on the display screen if predetermined positional information is input from the touch panel, with the analysis menu selection image displayed on the display screen.

4. The signal processing device according to claim 3, wherein the processing parameter setting unit includes at least a plurality of setting units among the center frequency setting unit, the frequency span setting unit, the amplitude level setting unit, and the measurement time setting unit, the display image data table stores a plurality of analysis menu selection images corresponding to the plurality of setting units included in the processing parameter setting unit and stores data for a display mode selection image for selecting any one of the analysis menu selection images, the control means further includes a display mode selection image output unit that reads the display mode selection image from the display image data table and outputs the display mode selection image so as to be displayed on a layer that is closer to a surface than the graph displayed on the display screen, if predetermined positional information is input from the touch panel; and deletes the display mode selection image when the analysis menu selection image is displayed, and if positional information, which corresponds to a touch operation of selecting any one of a plurality of selection buttons in the display mode selection image, is input from the touch panel, the analysis menu selection image output unit reads the analysis menu selection image corresponding to the positional information from the display image data table and outputs the analysis menu selection image to the display means.

5. The signal processing device according to claim 3, wherein the display image data table stores data for a toggle switch image, the control means further includes a toggle switch image output unit that reads the toggle switch image from the display image data table and outputs the toggle switch image so as to be displayed on the display screen, when the graph is displayed on the display screen, and if positional information corresponding to the toggle switch image is input from the touch panel, the display mode selection image output unit reads the display mode selection image from the display image data table.

6. A signal processing method of performing signal processing in a signal processing device which includes a processing parameter setting unit that sets a processing parameter for performing a predetermined process to an input signal, signal processing means for performing a predetermined process for the input signal on the basis of the processing parameter and outputting a graph display signal for displaying a graph in which a horizontal axis is a frequency and a vertical axis is an amplitude level, a touch panel that is provided so as to correspond to a display screen and includes a touch sensor which outputs positional information associated with a touch operation, a parameter data table that stores a plurality of the processing parameters corresponding to each positional information item, reads at least one of the processing parameters from the parameter data table, inputs the processing parameter to the processing parameter setting unit to change a signal processing mode of the signal processing means, and changes the display of the graph, the method comprising:

a step of specifying whether the positional information is input by a slide touch operation in one direction or the other direction, reading the processing parameter corresponding to the positional information from the parameter data table, and outputting the processing parameter to the processing parameter setting unit of the signal processing means, if the positional information corresponding to one parameter setting item is input from the touch panel.

7. The signal processing method according to claim 6, wherein the signal processing device further includes:

a processing parameter output unit that reads the processing parameter with different resolutions corresponding to the positional information from the parameter data table and outputs the processing parameter to the processing parameter setting unit, if the positional information is input from the touch panel; and an analysis menu selection image deletion unit that deletes an analysis menu selection image displayed on the display screen, and the signal processing method further includes:

a step of displaying analysis menu selection images including a plurality of parameter setting items with different resolutions on the display screen if predetermined positional information associated with the touch operation is input from the touch panel;

a branch step of determining whether to return an operation to the processing parameter output unit or to move the operation to the analysis menu selection image deletion unit, if predetermined positional information is input from the touch panel, with the analysis menu selection image displayed on the display screen; and a step of deleting the analysis menu selection image displayed on the display screen if predetermined positional information is input from the touch panel, with the analysis menu selection image displayed on the display screen.

* * * * *